United States Patent
Li et al.

(10) Patent No.: US 9,153,642 B2
(45) Date of Patent: Oct. 6, 2015

(54) METAL-OXIDE-METAL (MOM) CAPACITOR WITH ENHANCED CAPACITANCE

(71) Applicant: QUALCOMM Incorporated, San Diego, CA (US)

(72) Inventors: Xia Li, San Diego, CA (US); Bin Yang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/784,895

(22) Filed: Mar. 5, 2013

(65) Prior Publication Data

US 2014/0252543 A1 Sep. 11, 2014

(51) Int. Cl.
*H01L 49/02* (2006.01)
*H01L 23/522* (2006.01)
*H01L 27/07* (2006.01)
*H01L 29/94* (2006.01)

(52) U.S. Cl.
CPC ............ *H01L 28/60* (2013.01); *H01L 23/5223* (2013.01); *H01L 27/0733* (2013.01); *H01L 28/88* (2013.01); *H01L 28/92* (2013.01); *H01L 29/94* (2013.01); *H01L 2924/0002* (2013.01)

(58) Field of Classification Search
CPC ............... H01L 2924/00; H01L 2224/48247; H01L 2224/49111; H01L 23/5223; H01L 28/86
USPC .......... 257/532, 534, E21.008; 438/239, 396, 438/253
See application file for complete search history.

(56) References Cited

U.S. PATENT DOCUMENTS

| | | | |
|---|---|---|---|
| 5,583,359 A | 12/1996 | Ng et al. | |
| 6,747,307 B1 * | 6/2004 | Vathulya et al. | 257/307 |
| 6,825,080 B1 * | 11/2004 | Hu et al. | 438/250 |
| 7,485,914 B2 | 2/2009 | Huang et al. | |
| 8,237,209 B2 | 8/2012 | Chang et al. | |
| 8,247,288 B2 | 8/2012 | Xue et al. | |
| 2006/0024905 A1 | 2/2006 | He et al. | |
| 2010/0237463 A1 * | 9/2010 | Kang et al. | 257/532 |
| 2012/0043595 A1 * | 2/2012 | Chang et al. | 257/296 |

FOREIGN PATENT DOCUMENTS

WO 2010112971 A2 10/2010

OTHER PUBLICATIONS

International Search Report and Written Opinion for International Application No. PCT/US2014/017034, ISA/EPO, Date of Mailing May 20, 2014, 9 pages.
Written Opinion of the International Preliminary Examining Authority under PCT Rule 66 issued in corresponding PCT Application No. PCT/US2014/017034, mailed Jan. 22, 2015, 6 pages.

* cited by examiner

Primary Examiner — David Vu
Assistant Examiner — Jonathan Han
(74) Attorney, Agent, or Firm — Toler Law Group, PC

(57) ABSTRACT

A particular metal-oxide-metal (MOM) capacitor device includes a conductive gate material coupled to a substrate. The MOM capacitor device further includes a first metal structure coupled to the conductive gate material. The MOM capacitor device further includes a second metal structure coupled to the substrate and proximate to the first metal structure.

25 Claims, 11 Drawing Sheets

METAL-OXIDE-METAL (MOM) CAPACITOR WITH ENHANCED CAPACITANCE

I. FIELD

The present disclosure is generally related to metal-oxide-metal (MOM) capacitors in semiconductor devices.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and internet protocol (IP) telephones, can communicate voice and data packets over wireless networks. Also, such wireless telephones include electronic devices, such as a processor that can process executable instructions, including software applications, such as a web browser application, that can be used to access the Internet. As such, these wireless telephones can include significant computing capabilities.

Electronic devices may include passive components, such as inductors, resistors, and capacitors, that are widely used in tuning, filtering, impedance matching, and gain control of integrated circuits (IC). Among various types of capacitors, metal-oxide-metal (MOM) capacitors are used in analog tuning circuits, switched capacitor circuits, filters, resonators, up-conversion and down-conversion mixers, and analog/digital (A/D) converters. A challenge of capacitors in such applications includes having the MOM capacitors provide a large capacitance value or maintain a level of capacitance while taking up a small surface area of the IC.

III. SUMMARY

In a conventional metal-oxide-metal (MOM) capacitor formed using a complementary metal-oxide-semiconductor (CMOS) fabrication process, electrodes may include multiple metal layers formed on a substrate. A capacitance of the conventional MOM capacitor may be based on a capacitance of an adjacent pair of electrodes that includes capacitances between each metal layer of the adjacent pair of electrodes. One way to increase the capacitance of the conventional MOM capacitor without increasing a surface area (i.e., a "footprint") of the conventional MOM capacitor is by including conductive gate material or contact metal in the electrodes. For example, by including the conductive gate material, an additional capacitance may be formed between the conductive gate material and a conductive gate material of an adjacent electrode. An additional capacitance may be similarly formed between two contact metal portions of adjacent electrodes. To further increase the capacitance of the conventional MOM capacitor, additional electrodes may be added. However, the surface area of the conventional MOM capacitor may be constrained by design rules associated with the CMOS fabrication process, which may prevent the conventional MOM capacitor from achieving a particular capacitance without an undesired increase in surface area.

A MOM capacitor formed in accordance with the present disclosure includes electrode pairs connected to a substrate to enable an enhanced capacitance, as compared to the conventional MOM capacitor. For example, a first electrode pair may include a first electrode and a second electrode both connected to (e.g., in contact with or "extending" to) the substrate, thus forming an additional capacitance as compared to MOM capacitors that include electrodes not "extending" to a substrate.

Further, materials of the first electrode and the second electrode may be selected so that a distance between the first electrode and the second electrode is substantially equal to a "minimum" permitted distance defined by one or more fabrication design rules (e.g., CMOS fabrication design rules). For example, according to design rules, a permitted distance between a conductive gate material and a contact metal may be less than a permitted distance between two adjacent contact metals or two adjacent conductive gate materials. Therefore, by including conductive gate material in the first electrode and including contact metal in the second electrode, the distance between the first electrode and the second electrode may be reduced, thus enabling higher density of electrode pairs of the MOM capacitor. Accordingly, reducing the distance between the first electrode and the second electrode may increase a capacitance of the MOM capacitor and enable reduced surface area of the MOM capacitor, which may enable a high capacitance of the MOM capacitor exceeding a particular surface area specified by a design of the MOM capacitor.

In a particular embodiment, a MOM capacitor device includes a conductive gate material coupled to a substrate. The MOM capacitor device further includes a first metal structure coupled to the conductive gate material. The MOM capacitor device further includes a second metal structure coupled to the substrate and proximate to the first metal structure. The first metal structure is coupled to a first higher metal structure by use of a via structure.

In another particular embodiment, a method of forming a MOM capacitor device includes forming a first electrode. The first electrode includes a conductive gate material. The method further includes forming a second electrode. The second electrode includes a contact metal. The second electrode is proximate to the first electrode.

In another particular embodiment, a MOM capacitor device includes first means for enabling charge accumulation coupled to a substrate. The first means for enabling charge accumulation includes a conductive gate material. The MOM capacitor device further includes second means for enabling charge accumulation coupled to the substrate. The second means for enabling charge accumulation includes a contact metal. The second means for enabling charge accumulation are proximate to the first means for enabling charge accumulation.

In another particular embodiment, a non-transitory computer-readable medium includes processor-executable instructions that, when executed by a processor, cause the processor to initiate fabrication of a MOM capacitor device. The MOM capacitor device is fabricated by forming a first electrode. The first electrode includes a conductive gate material. The MOM capacitor device is further fabricated by forming a second electrode. The second electrode includes a contact metal. The second electrode is proximate to the first electrode.

One particular advantage provided by at least one of the disclosed embodiments is enhanced capacitance of a MOM capacitor as compared to a conventional MOM capacitor. For example, by including both conductive gate materials and contact metals in electrodes of the MOM capacitor, the capacitance of the MOM capacitor may be increased (e.g., a capacitance of the MOM capacitor includes a capacitance between the conductive gate materials and the contact metals). Further, because a distance between the conductive gate material and the contact metal (e.g., a gate-to-contact "pitch") is less than a distance between two adjacent conductive gate materials (e.g., a gate-to-gate pitch) or a distance between two adjacent contact metals (e.g., a contact-to-contact pitch), alternating disposition of conductive gate materials and contact metals enables a reduced surface area of the MOM capacitor as compared to other configurations of conductive gate materials and contact metals. Additionally, the capacitance of the MOM capacitor is further enhanced based on the distance between the electrodes (e.g., the gate-to-contact pitch).

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

DETAILED DESCRIPTION

Figure 1:
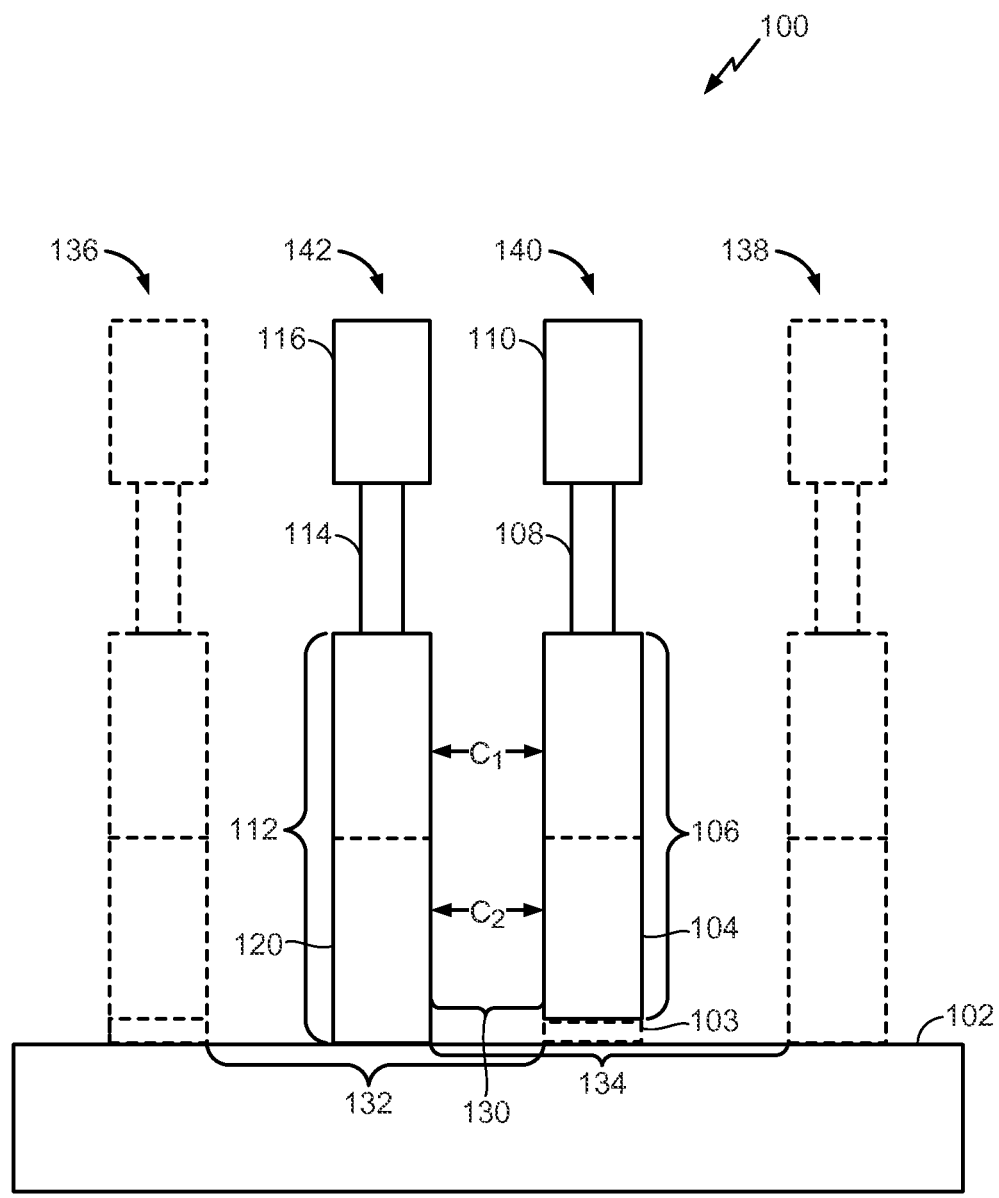
FIG. 1 is a diagram of a particular embodiment illustrating a metal-oxide-metal (MOM) capacitor.

Referring to FIG. 1, a particular embodiment of a metal-oxide-metal (MOM) capacitor is depicted and generally designated 100. The MOM capacitor 100 includes a first electrode 140 and a second electrode 142, that are formed on a substrate 102.

The first electrode 140 includes a conductive gate material 104 that is coupled to the substrate 102. For example, the conductive gate material 104 may be coupled to the substrate 102 via an intervening gate dielectric layer 103 as depicted in FIG. 1. The first electrode 140 further includes a first metal structure 106 that includes the conductive gate material 104. For example, the first metal structure 106 may be entirely formed of the conductive gate material 104, or a lower portion of the first metal structure 106 may include the conductive gate material 104 while an upper portion of the first metal structure 106 (e.g., a "metal 0" layer local connection associated with a complementary metal-oxide-semiconductor (CMOS) design) may be formed of a different metal or material than the lower portion. The first metal structure 106 is coupled to a first higher metal structure 110 (e.g., a "metal 1" layer structure) through a first via structure 108. To illustrate, the first higher metal structure 110 may include one or more metal lines in one or more upper metal layers of a semiconductor device.

The second electrode 142 includes a second metal structure 112 that is coupled to the substrate 102. For example, as shown in FIG. 1, the second metal structure 112 includes a contact metal 120 that is coupled to the substrate 102. The contact metal 120 may include a metal that is appropriate for use as a contact of a transistor, such as for a source contact or a drain contact of a transistor. In a particular embodiment, the conductive gate material 104 and the contact metal 120 are different materials. For example, the conductive gate material 104 may be a metal gate titanium nitride (TiN) film and the contact metal 120 may be tungsten. Using tungsten for the contact metal 120 may reduce copper diffusion into the substrate 102. The second metal structure 112 may be formed entirely of the contact metal 120 or may have a lower portion formed of the contact metal 120 and an upper portion formed (e.g., a "metal 0" layer local connection) of another conductive material, such as copper. The second metal structure 112 is coupled to a second higher metal structure 116 (e.g., a "metal 1" layer structure) through a second via structure 114. To illustrate, the second higher metal structure 116 may include one or more metal lines in one or more upper metal layers of the semiconductor device.

During operation, the first electrode 140 and the second electrode 142 may each be biased according to a corresponding voltage, and the first electrode 140 may conduct charge (e.g., the first electrode 140 and the second electrode 142 may correspond to conductive plates in a plate capacitor). A capacitance may exist between the first electrode 140 and the second electrode 142. For example, the capacitance may include a capacitance $C_1$ based on a first capacitance between the first higher metal structure 110 and the second higher metal structure 116, a second capacitance between the first via structure 108 and the second via structure 114, and a third capacitance between at least a portion of the first metal structure 106 and at least a portion of the second metal structure 112. The capacitance $C_1$ may correspond to a capacitance of a conventional MOM capacitor that does not include electrodes extending to the substrate 102 (e.g., electrodes including conductive gate material coupled to the substrate 102 or including contact metal coupled to the substrate 102). The capacitance of the MOM capacitor 100 also includes a capacitance $C_2$ between the portion of the first metal structure 106 including the conductive gate material 104 and the portion of the second metal structure 112 including the contact metal 120. Thus, because the first electrode 140 and the second electrode 142 are extended to the substrate 102, the capacitance (e.g., $C_1$ and $C_2$) of the MOM capacitor 100 is increased without increasing a footprint (e.g., a surface area) of the MOM capacitor 100 on the substrate 102.

Further, because the first electrode 140 includes the conductive gate material 104 and the second electrode 142 includes the contact metal 120, the MOM capacitor 100 has increased capacitance as compared to configurations where two adjacent electrodes each include conductive gate material or where two adjacent electrodes each include contact metal. To illustrate, the first metal structure 106 including the conductive gate material 104 and the second metal structure 112 including the contact metal 120 may be formed in accordance with conventional transistor fabrication processing. For example, the conductive gate material 104 and/or the gate dielectric layer 103 may be formed according to a conventional transistor gate formation process, and the contact metal 120 may be formed in accordance with a conventional transistor source and/or drain contact metal deposition and formation. For example, the conductive gate material 104 and the contact metal 120 may be deposited and patterned in accordance with a CMOS fabrication process (e.g., during a CMOS fabrication process used to form other components of the semiconductor device).

In addition, by including the conductive gate material 104 in the first electrode 140 and by including the contact metal 120 in the second electrode 142, a distance between the first electrode 140 and the second electrode 142 may be substantially equal to a "minimum" permitted gate-to-contact pitch 130. The minimum gate-to-contact pitch 130 may be defined by one or more fabrication design rules, such as design rules specified by an industry standard or by a particular fabrication facility, to be smaller than a minimum permitted contact-to-contact pitch 134 or a minimum permitted gate-to-gate pitch 132. For example, the minimum permitted contact-to-contact pitch 134 may be associated with a pitch between the contact metal 120 and a third electrode 138 that includes a contact metal. The minimum permitted gate-to-gate pitch 132 may be associated with a pitch between the conductive gate material 104 and a fourth electrode 136 that includes a conductive gate material. As a result, a distance between the first electrode 140 and the second electrode 142 may be smaller than would be possible in other configurations where adjacent electrodes include the contact metal 120 (and are limited by the minimum permitted contact-to-contact pitch 134) or configurations where adjacent electrodes include the conductive gate material 104 (and are limited by the minimum permitted gate-to-gate pitch 132) based on the design rules.

As will be appreciated, by including the conductive gate material 104 in the first electrode 140 and including the contact metal 120 in the second electrode 142, the MOM capacitor 100 advantageously may be configured according to the smallest permitted distance between electrodes available according to design rules. By having a reduced distance between the first electrode 140 and the second electrode 142, a capacitance between the electrodes 140 and 142 (e.g., $C_1+C_2$) may be increased based on the reduced distance. Further, by having a reduced distance between the first electrode 140 and the second electrode 142, the footprint (e.g., the surface area) of the MOM capacitor 100 may be reduced as compared to the other configurations (e.g., adjacent electrodes each including the conductive gate material 104 or each including the contact metal 120).

Figure 2:
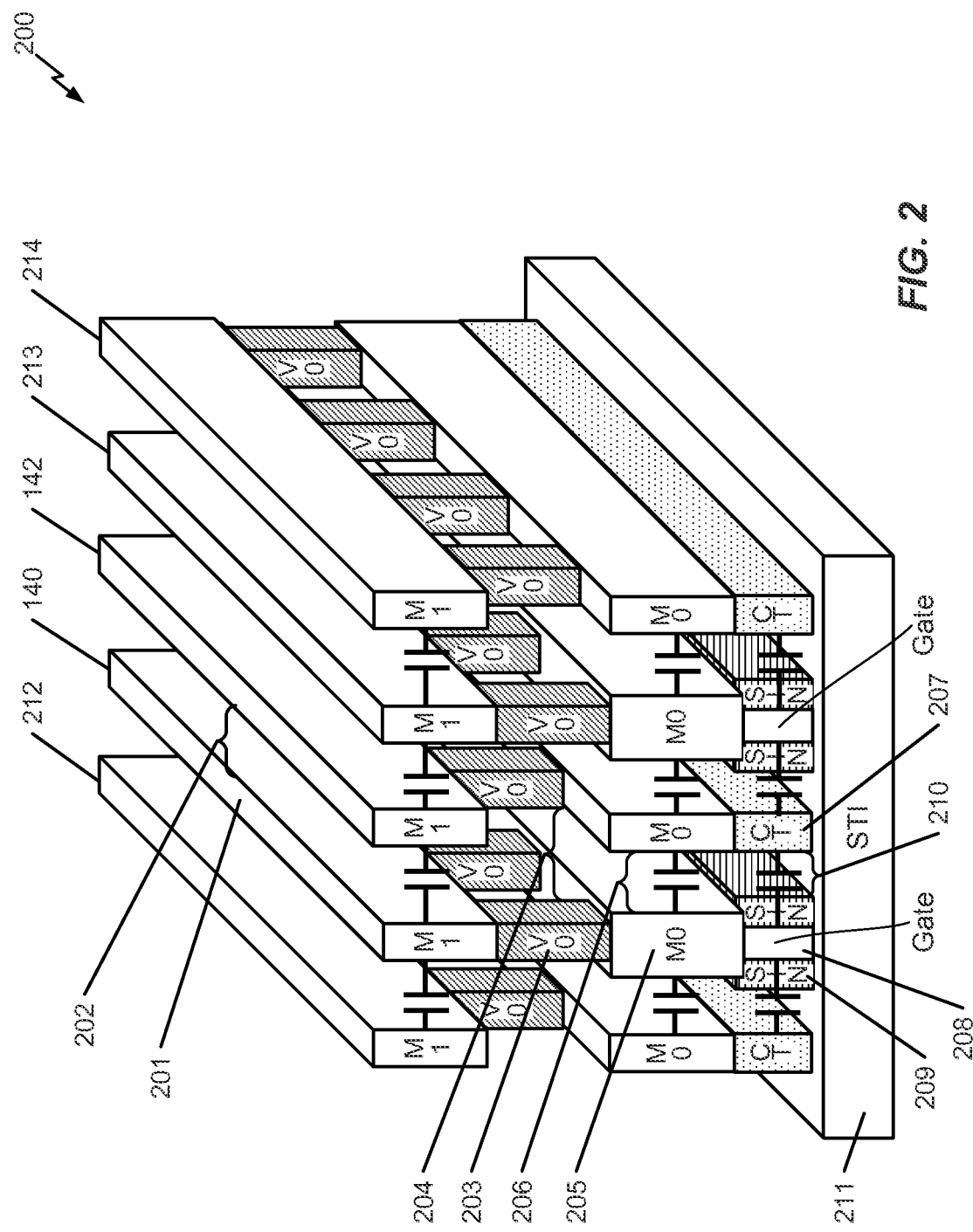
FIG. 2 is a perspective diagram of a particular embodiment illustrating a MOM capacitor disposed on an insulating substrate.

FIG. 2 is a perspective diagram showing a particular embodiment of a metal-oxide-metal (MOM) capacitor 200 disposed on a substrate 211. The MOM capacitor 200 may be the MOM capacitor 100 of FIG. 1. The MOM capacitor 200 includes a first layer (the first layer on the substrate 211) that includes first electrode portions 207, gate structures 208, spacer structures 209, and first dielectric portions 210 (depicted as transparent portions between the first electrode portions 207 and the spacer structures 209). The first electrode portions 207 may be the contact portion of the second metal structure 112 including the contact metal 120 and the gate structures 208 may be the portion of the first metal structure 106 including the conductive gate material 104, respectively, of FIG. 1. The MOM capacitor 200 includes a second layer (e.g., a metal 0" layer local connection disposed on the first layer) that includes second electrode portions 205 and second dielectric portions 206 (depicted as transparent portions between the second electrode portions 205). The second electrode portions 205 may be the upper portion of the first metal structure 106 and the upper portion of the second metal structure 112 of FIG. 1. The MOM capacitor 200 includes a connection layer a "via 0" layer disposed on the second layer) that includes conductive connection portions 203 and dielectric connection portions 204 (depicted as transparent portions between the conductive connection portions 203). The conductive connection portions 203 may be the first via structure 108 and the second via structure 114 of FIG. 1. The MOM capacitor 200 includes a third layer (e.g., a "metal 1" layer disposed on the connection layer) that includes third electrode portions 201 and third dielectric portions 202 (depicted as transparent areas between the third electrode portions 201). The third electrode portions 201 may be the first higher metal structure 110 and the second higher metal structure 116 of FIG. 1. The MOM capacitor 200 may be formed on a shallow trench isolation (STI) layer of the substrate 211. Conductive structures extending (in a direction perpendicular to the substrate 211) from the first layer to the third layer may form electrodes 140, 142, and 212-214. The number of the electrodes 140, 142, and 212-214 shown in FIG. 2 is illustrative; additional electrodes or fewer electrodes may be used.

In the first layer, the first electrode portions 207 and the gate structures 208 may be disposed on the substrate 211 alternately in parallel and spaced at a substantially equal distance. The distance between the first electrode portions 207 and the gate structures 208 may correspond to the minimum permitted gate-to-contact pitch 130 of FIG. 1, and may be based on a design rule. The first dielectric portions 210 may include dielectric materials disposed between the first electrode portions 207 and the gate structures 208. In the second layer, the second electrode portions 205 may be disposed in parallel and spaced at a substantially equal distance. The second dielectric portions 206 may include dielectric materials disposed between the second electrode portions 205. The second electrode portions 205 may be disposed on the first electrode portions 207 and the gate structures 208. By use of the gate structures 208 and the first electrode portions 207, the MOM capacitor 200 may be extended to the substrate 211.

In the third layer, the third electrode portions 201 may be disposed in parallel and spaced at a substantially equal distance. The third dielectric portions 202 may include dielectric materials disposed between the third electrode portions 201. The conductive connection portions 203 may be disposed on the second electrode portions 205 and between the second electrode portions 205 and the third electrode portions 201. The conductive connection portions 203 may include via structures such as trench vias that have a width and length that are less than or equal to a width and length of the corresponding third electrode portions 201.

The substrate 211 may include a substantially non-conductive material portion, such as a shallow trench isolation (STI)-type material portion. In a particular embodiment, the substrate 211 may include an oxide material. The first layer of the MOM capacitor 200 (including the gate structures 208) may be disposed over the STI-type material portion.

Figure 3:
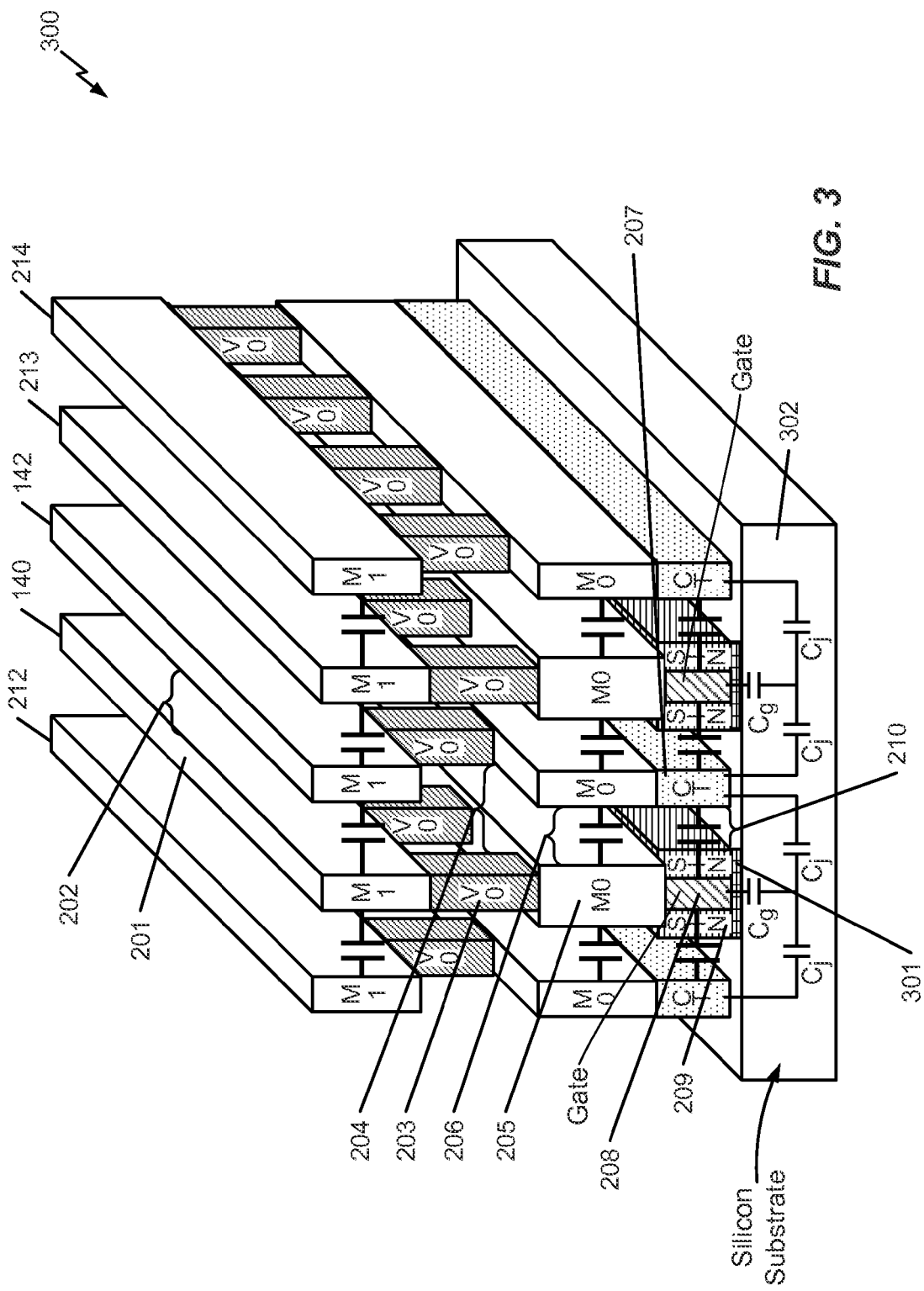
FIG. 3 is a perspective diagram of a particular embodiment illustrating a MOM capacitor disposed on a silicon substrate.

The electrodes 140, 142, and 212-214 may be alternately interconnected to form a first set of electrodes connected by a first electrode connector and a second set electrodes connected by a second electrode connector, as described further with reference to FIG. 3. The first electrode connector may be coupled to receive a first signal source and the second electrode connector may be coupled to receive a second signal source. Such a construction may form a MOM capacitor with capacitors wired in parallel (e.g., a first capacitor plate formed by the electrodes 142 and 212, 214 and a second capacitor plate formed by the electrodes 140 and 213), as further described below.

During operation, the first signal source and the second signal source may cause a voltage difference to occur between the first electrode connector and the second electrode connector. For example, the voltage difference may occur between the electrode 140 and the electrode 142. The voltage difference may cause the electrode 140 and the electrode 142 to act as a plate capacitor. Each set of electrodes of the electrodes 140, 142, and 212-214 may act as a capacitor plate based on the voltage difference.

A capacitance of the MOM capacitor 200 may be based on several components. For example, a first component of the capacitance may be a first capacitance between the first electrode portions 207 and the gate structures 208. A second component of the capacitance may be a second capacitance between the second electrode portions 205. A third component of the capacitance may be a third capacitance between the third electrode portions 201. The capacitance may include additional components similar to the first capacitance, the second capacitance, and the third capacitance, based on each set of the electrodes (e.g., each set of the gate structures 208 and the first electrode portions 207) disposed alternately within the MOM capacitor 200.

By extending the electrodes 140, 142, and 212-214 to the substrate 211 (e.g., including the first electrode portions 207 in the electrode 142 and including the gate structures 208 in the electrode 140), a capacitance of the MOM capacitor 200 may be increased as compared to a conventional MOM capacitor that does not extend electrodes to the substrate 211. For example, in a particular embodiment, the first component of the capacitance formed by the first electrode portions 207 and the gate structures 208 may increase the capacitance of the MOM capacitor 200 by approximately 18% using a same surface area ("footprint") of the substrate 211 as compared to the conventional MOM capacitor that does not extend electrodes to the substrate 211 (e, the conventional MOM capacitor that does not include the gate structures 208 and the first electrode portions 207).

In another particular embodiment, the first component of the capacitance formed by the first electrode portions 207 and the gate structures 208 may enable a footprint (e.g., a surface area) of the MOM capacitor 200 to be approximately 18% smaller than a footprint of the conventional MOM capacitor (e.g., the conventional MOM capacitor does not dispose the gate structures 208 and the first electrode portions 207 alternately and in parallel) while providing substantially similar capacitance. For example, the smaller footprint of the MOM capacitor 200 may be based on the minimum permitted gate-to-contact pitch between the gate structures 208 and the first electrode portions 207. By reducing a distance between the gate structures 208 and the first electrode portions 207 to the minimum permitted gate-to-contact pitch, the capacitance of the MOM capacitor 200 may be further increased based on the reduced distance.

Referring to FIG. 3, a perspective diagram shows a particular embodiment of a MOM capacitor 300 disposed on a semiconductor substrate, such as a silicon portion of a substrate 302. The MOM capacitor 300 includes the first electrode portions 207 (e.g., the contact portions), the gate structures 208, the spacer structures 209, the first dielectric portions 210, the second electrode portions 205 (e.g., the "metal 0" layer local connections), the second dielectric portions 206, the conductive connection portions 203 (e.g., the "via 0" layer), the dielectric connection portions 204, the third electrode portions 201 (e.g., the "metal 1" layer structures), and the third dielectric portions 202 of FIG. 2. The gate structures 208 may be isolated from the silicon portion of the substrate 302 via an electrically insulating layer, such as a high dielectric constant (e.g., a high-K) material layer or a gate oxide layer 301. The MOM capacitor 300 may also include the electrodes 140, 142, and 212-214 of FIG. 2, and the electrodes 140, 142, and 212-214 may be connected to a first electrode connector and a second electrode connector, as described with reference to FIG. 2.

During operation, a first signal source applied to the first electrode connector and a second signal source applied to the second electrode connector may cause a voltage difference to occur between the first electrode connector and the second electrode connector. The voltage difference may cause the MOM capacitor 300 to conduct charge (e.g., act as a plate capacitor) and thereby induce a capacitance in the MOM capacitor 300. The capacitance of the MOM capacitor 300 may be based on several components, such as a first capacitance, a second capacitance, and a third capacitance as described with reference to FIG. 2. The capacitance may include additional components similar to the first capacitance, the second capacitance, and the third capacitance, based on each set of the electrodes 140, 142, and 212-214 (e.g., each set of the gate structures 208 and the first electrode portions 207) disposed alternately within the MOM capacitor 300.

The capacitance of the MOM capacitor 300 may further include additional components based on formation of the MOM capacitor 300 on the silicon portion of the substrate 302. For example, a metal-oxide-silicon (MOS) gate structure within the silicon portion of the substrate 302 may result in a first additional gate capacitance (Cg) across the gate oxide layer 301 and a second additional junction capacitance (Cj) between the gate oxide layer 301 and the first electrode portions 207 due to charge accumulation. In a particular embodiment, the gate structures 208 may be a same type of material as a substrate well and a junction of a MOS structure (e.g., the MOM capacitor 300). In the particular embodiment, the gate structures 208 are sufficiently biased such that the MOM capacitor 300 operates in an accumulation mode, thereby adding the gate capacitance (Cg) without adding the junction capacitance (0).

As illustrated in FIG. 3, the MOM capacitor 300 is deposited on a silicon portion of the substrate 302 rather than on the STI portion of the substrate 211. In addition, the gate oxide layer 301 is deposited between the silicon portion of the substrate 302 and the gate structures 208. Such construction may provide additional capacitance for the MOM capacitor 300. The additional capacitance may be based on capacitors formed by the gate structures 208 acting as first electrodes and the first electrode portions 207 acting as second electrodes. In a particular embodiment, the gate oxide layer 301 and the silicon portion of the substrate 302 may act as dielectric media between the first electrodes and the second electrodes. The MOM capacitor 300 may provide a larger capacitance (e.g., a capacitance including Cg) than the MOM capacitor 200 of FIG. 2, while the MOM capacitor 200 of FIG. 2 may provide enhanced high-frequency characteristics as compared to the MOM capacitor 300 of FIG. 3. For example, disposing the MOM capacitor 200 on the STI-type material portion of the substrate 211 may reduce high frequency (e.g., greater than 1 GHz) signal degradation or high frequency signal loss via the MOM capacitor 200.

Figure 4:
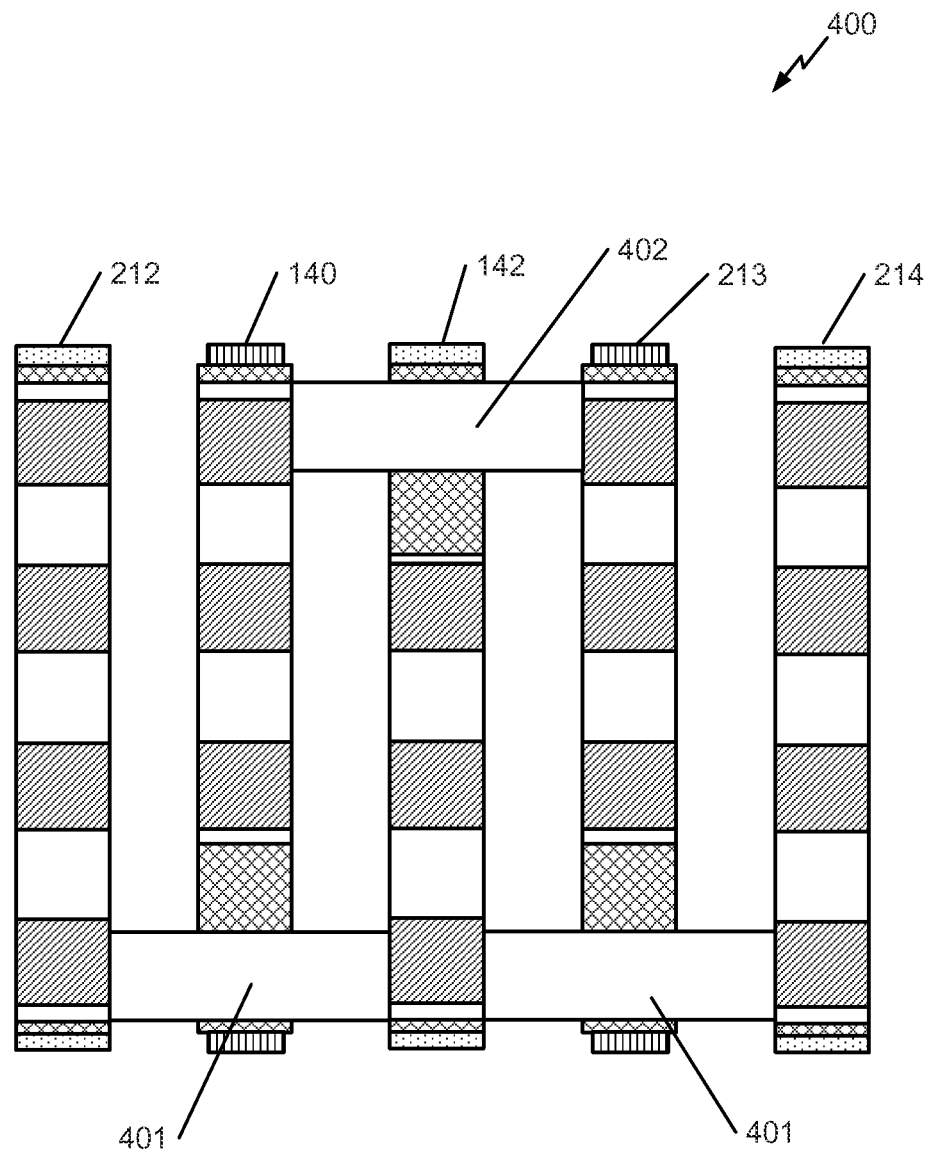
FIG. 4 is a diagram of a particular embodiment illustrating a top view of a MOM capacitor.

Referring to FIG. 4, a diagram showing a top view of a MOM capacitor is depicted and generally designated 400. The MOM capacitor 400 may include the MOM capacitor 200 of FIG. 2 or the MOM capacitor 300 of FIG. 3. The MOM capacitor 400 includes electrodes 140, 142, and 212-214, a first electrode connector 401, and a second electrode connector 402. The electrodes 140, 142, and 212-214 may be the electrodes 140, 142, and 212-214 of FIG. 2 or the electrodes 140, 142, and 212-214 of FIG. 3.

The first electrode connector 401 may couple the electrodes 212, 142, and 214 to a first signal source. The second electrode connector 402 may couple the electrodes 213 and 140 to a second signal source. Such connections may form a MOM capacitor, such as the MOM capacitor 400, with multiple parallel capacitor connections. For example, the first signal source and the second signal source may cause a voltage difference to occur between the electrode 140 and the electrode 142. The voltage difference may cause the electrode 140 and the electrode 142 to conduct charge (e.g., act as capacitor plates of a plate capacitor). Each set of electrodes of the electrodes 140, 142, and 212-214 (e.g., the electrodes 212 and 140, the electrodes 140 and 142, the electrodes 142 and 213, and the electrodes 213 and 214) may act as a conventional capacitor based on the voltage difference.

Figure 5:
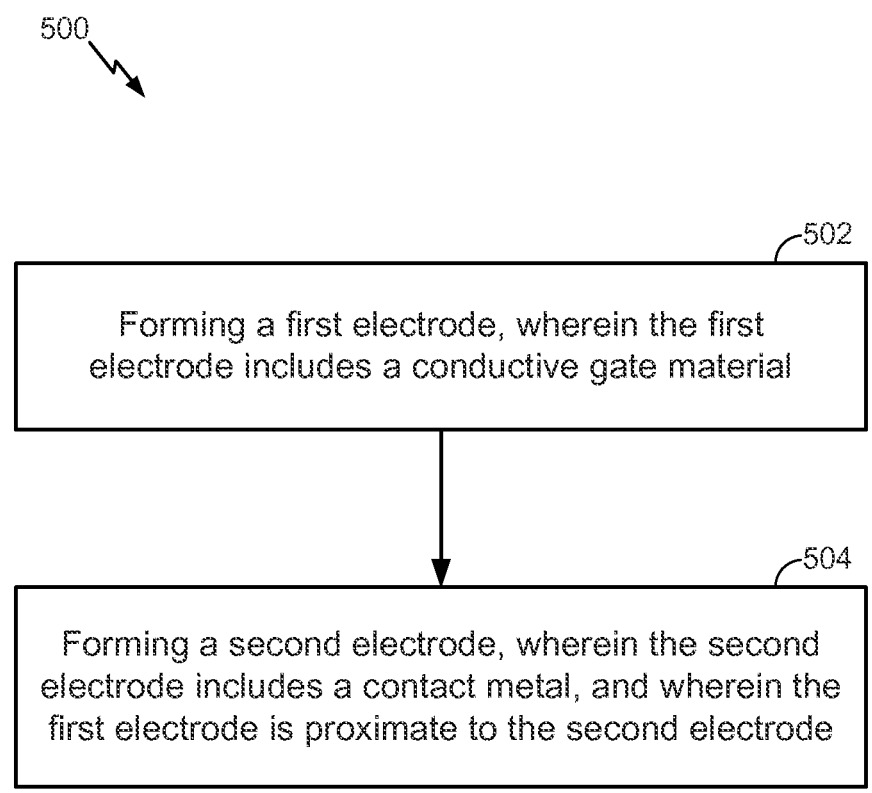
FIG. 5 is a flowchart of a first illustrative embodiment of a method of forming a MOM capacitor.

Referring to FIG. 5, a flow chart of a first illustrative embodiment of a method of forming a MOM capacitor is depicted and generally designated 500. The MOM capacitor may include the MOM capacitor 100 of FIG. 1, the MOM capacitor 200 of FIG. 2, the MOM capacitor 300 of FIG. 3, or the MOM capacitor 400 of FIG. 4. One or more operations of the method 500 may be initiated by a processor integrated into an electronic device, as described further with reference to FIG. 10.

The method 500 includes forming a first electrode at 502. The first electrode includes a conductive gate material. The conductive gate material may be the conductive gate material 104 of FIG. 1, the gate structures 208 of FIG. 2, or the gate structures 208 of FIG. 3. In a particular embodiment, the first electrode may be disposed on a substrate. The substrate may be the substrate 102 of FIG. 1, the STI portion of the substrate 211 of FIG. 2, or the silicon portion of the substrate 302 of FIG. 3. The first electrode may be formed by depositing the conductive gate material on the substrate. The conductive gate material may be deposited using a film deposition process, such as a chemical vapor deposition (CVD) process, a spin-on process, a plasma-enhanced chemical vapor deposition (PECVD) process, a physical vapor deposition (PVD) process, or an atomic layer deposition (ALD) process, followed by a chemical-mechanical planarization (CMP) process. An additional upper portion of the first electrode may be formed using a similar process with a different material.

At 504, a second electrode is formed. The second electrode includes a contact metal. The contact metal may be the portion of the second metal structure 112 including the contact metal 120 of FIG. 1, the first electrode portions 207 of FIG. 2, or the first electrode portions 207 of FIG. 3. The first electrode is proximate to the second electrode. The contact metal may be formed by depositing the contact metal using a film deposition process followed by a CMP process. An additional upper portion of the second electrode may be formed using a similar process with a same or different material.

By including the conductive gate material in the first electrode and including the contact metal in the second electrode, the MOM capacitor formed by the method 500 advantageously may be configured according to the smallest permitted distance between electrodes available according to design rules. By having a reduced distance between the first electrode and the second electrode, a capacitance between the first electrode and the second electrode may be increased based on the reduced distance. Further, by having a reduced distance between the first electrode and the second electrode, the footprint (e.g., the surface area) of the MOM capacitor may be reduced as compared to the other configurations (e.g., adjacent electrodes each including the conductive gate material or each including the contact metal).

Figure 6:
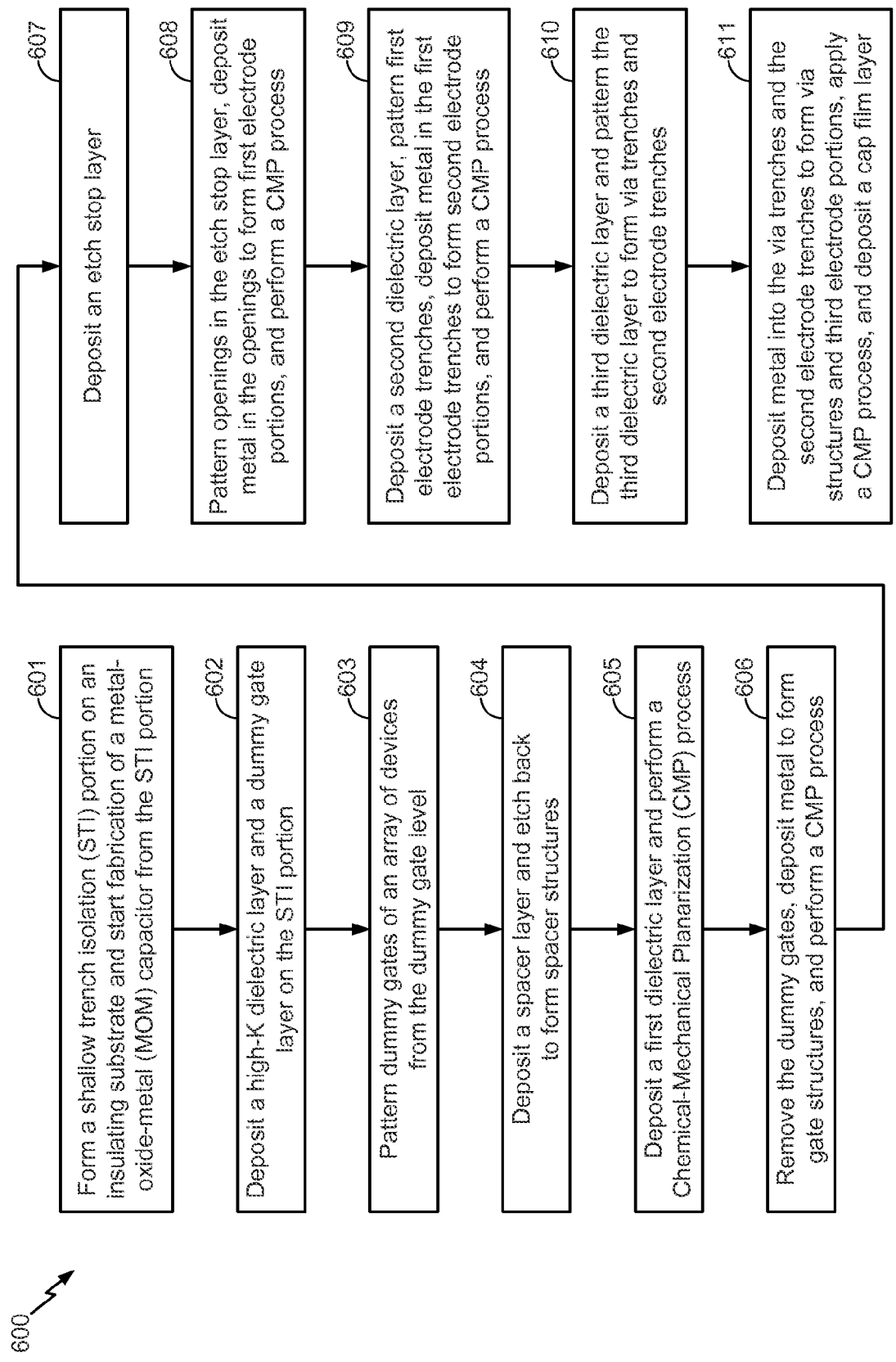
FIG. 6 is a flowchart of a second illustrative embodiment of a method of forming a MOM capacitor.

Referring to FIG. 6, a flow chart of a second illustrative embodiment of a method of forming a MOM capacitor is depicted and generally designated 600. The MOM capacitor may include the MOM capacitor 100 of FIG. 1, the MOM capacitor 200 of FIG. 2, the MOM capacitor 300 of FIG. 3, or the MOM capacitor 400 of FIG. 4.

The method 600 includes forming a shallow trench isolation (STI) portion of an insulating substrate (e.g., a silicon wafer) and starting fabrication of the MOM capacitor from the STI portion, at 601. The insulating substrate may be the substrate 102 of FIG. 1 or the STI portion of the substrate 211 of FIG. 2. The STI portion may be formed by etching a trench and performing a film deposition process, such as a chemical vapor deposition (CVD) process, a spin-on process, a plasma-enhanced chemical vapor deposition (PECVD) process, or a high density plasma chemical vapor deposition (HDPCVD) process, followed by a chemical-mechanical planarization (CMP) process.

At 602, a high-K dielectric layer and a dummy gate layer are formed on the STI portion of the substrate. The high-K dielectric layer may be an oxide layer, such as the gate oxide layer 301 of FIG. 3, or the intervening gate dielectric layer 103 of FIG. 1. In a particular embodiment, the dummy gate layer may include agate material used during CMOS transistor fabrication, such as a polysilicon film. The dummy gate layer may be formed by a film deposition process, such as a CVD process or a PECVD process, followed by a CMP process.

At 603, dummy gates are patterned, such as for an array of transistor-type devices, from the dummy gate layer. In a particular embodiment, a photolithography and etch process may be used to pattern (e.g., form) the dummy gates. The dummy gates are patterned based on a shape and a size of gate structures used in the MOM capacitor. For example, the dummy gates may be patterned based on the first metal structure 106 (e.g., the conductive gate material 104) of FIG. 1, the gate structures 208 of FIG. 2, or the gate structures 208 of FIG. 3. A width of the dummy gates may be associated with the gate structures. For example, the width may be associated with the first metal structure 106 (e.g., the conductive gate material 104) of FIG. 1, the gate structures 208 and the spacer structures 209 of FIG. 2, or the gate structures 208 and the spacer structures 209 of FIG. 3. In a particular embodiment, the width of the dummy gates is approximately 20 nm.

At 604, a spacer layer is deposited and etched back to form spacer structures. The spacer structures may be the spacer structures 209 of FIG. 2 or the spacer structures 209 of FIG. 3. The spacer layer may be composed of any suitable material with a high dielectric constant to increase capacitance, such as silicon nitride (SiN). The spacer layer may be formed by a film deposition process, such as a CVD process or a PECVD process. After the spacer layer is deposited, a thickness of the spacer layer may be comparable to the thickness of the dummy gate layer. The spacer layer may be etched back (e.g., by plasma dry etching) to form the spacer structures. The spacer structures may be formed in accordance with gate spacer structure processing for transistors in another portion of the silicon wafer.

At 605, a first dielectric layer is deposited and a CMP process is performed. The first dielectric portion may be deposited on the STI portion of the substrate. The first dielectric layer deposited may be the first dielectric portions 210 of FIG. 2 or the first dielectric portions 210 of FIG. 3. In a particular embodiment, the first dielectric layer may be composed of silicon oxide based materials, such as undoped silicate glass (USG), fluorinated silicate glass (FSG), plasma-enhanced chemical vapor deposition (PECVD) silicon oxide, or oxide/nitride/oxide. In another particular embodiment, the first dielectric layer may be composed of dielectric materials with a high dielectric constant, such as tantalum oxide ($Ta_2O_5$), hafnium oxide ($HfO_2$), hafnium oxynitride (MON), barium strontium titanate ($Ba_zSr_{(1-z)}TiO_3$ (BST)), barium titanium oxide ($BaTiO_3$), strontium titanium oxide ($SrTiO_3$), lead titanium oxide ($PbTiO_3$), lead zirconate titanate ($Pb(Zr,Ti)O_3$ [PZT]), lead lanthanum zirconate titanate (($Pb, La)(Zr,Ti)O_3$ [PLZT], lead lanthanum titanate (($Pb, La)TiO_3$ [PLT], tantalum oxide ($Ta_2O_5$), potassium nitrate ($KNO_3$), aluminum oxide ($Al_2O_3$), or lithium niobium oxide ($LiNbO_3$). A thickness of the first dielectric layer may be comparable to the thickness of the dummy gate layer after a CMP process is performed on the dummy gates, the spacer layer, and the first dielectric layer. In a particular embodiment, the CMP process may be performed on the first dielectric layer, the spacer layer, the dummy gates, or a combination thereof, to smooth a surface and to even out irregular topography.

At 606, the dummy gates are removed, metal is deposited to form gate structures, and a CMP process is performed. For example, the dummy gates may be removed to form recesses via application of a wet etch process or a plasma etching process. The metal may be deposited in the recesses to form the gate structures. The gate structures may be the first metal structure 106 (e.g., the conductive gate material 104) of FIG. 1, the gate structures 208 of FIG. 2 or the gate structures 208 of FIG. 3. The gate structures may be composed of metals or metal alloys, such as titanium nitride (TiN), tantalum nitride (TaN), tungsten (W), aluminum (Al), aluminum-copper alloy (Al—Cu), aluminum-neodymium (Al—Nd), or aluminum-tantalum (Al—Ta). In a particular embodiment, the gate structures may be formed by a film deposition process, such as an ALD process, a CVD process, a sputtering process, or an electroplating process. The CMP process may be performed on the gate structures to remove extra gate material, smooth a surface, even out irregular topography, or a combination thereof.

At 607, an etch stop layer is deposited. The etch stop layer may be composed of silicon carbide (SiC) (optionally doped with carbon) or silicon nitride (SiN) (optionally doped with nitrogen). The etch stop layer may be formed by a film deposition process, such as a CVD process, a PECVD process, or a PVD process.

At 608, openings are patterned in the etch stop layer, metal is deposited in the openings to form first electrode portions, and a CMP process is performed. The first electrode portions may be the second metal structure 112 (e.g., the contact metal 120) of FIG. 1, the first electrode portions 207 of FIG. 2 or the first electrode portions of FIG. 3. In a particular embodiment, the first electrode portions may be formed via, a single damascene process (e.g., a process to pattern an opening in a material, deposit metal into the opening, and remove excess metal via a CMP process). For example, a photolithography and etch process may be performed to pattern the openings corresponding to the first electrode portions. The metal deposited in the openings may be metal or metal alloy such as copper (Cu), aluminum-copper alloy (Ala), tantalum (Ta), titanium (TO, tungsten (W), or silver (AO. The first electrode portions may be formed by a film deposition process, such as a PVD process, a sputtering process, or an electroplating process.

At 609, a second dielectric layer is deposited, first electrode trenches are patterned in the second dielectric layer, metal is deposited in the first electrode trenches to form second electrode portions, and a CMP process is performed. The second dielectric layer may be deposited on the gate structures, the first electrode portions, the first dielectric layer, or a combination thereof. The second electrode portions may be the second electrode portions 205 of FIG. 2 or the second electrode portions 205 of FIG. 3. The second dielectric layer may be the second dielectric portions 206 of FIG. 2 or the second dielectric portions 206 of FIG. 3. In a particular embodiment, the second dielectric layer may be composed of silicon oxide based materials, such as undoped silicate glass (USG), fluorinated silicate glass (TSG), plasma-enhanced chemical vapor deposition (PECVD) silicon oxide, or oxide/nitride/oxide. In another particular embodiment, the second dielectric layer may be composed of dielectric materials with a high dielectric constant, such as tantalum oxide ($Ta_2O_5$), hafnium oxide ($HfO_2$), hafnium oxynitride (HfON), barium strontium titanate ($Ba_zSr_{(1-z)}TiO_3$ (BST)), barium titanium oxide ($BaTiO_3$), strontium titanium oxide ($SrTiO_3$), lead titanium oxide ($PbTiO_3$), lead zirconate titanate ($Pb(Zr,Ti)O_3$ [PZT]), lead lanthanum zirconate titanate (($Pb, La)(Zr,Ti)O_3$ [PLZT], lead lanthanum titanate (($Pb, La)TiO_3$ [PLT], tantalum oxide ($Ta_2O_5$), potassium nitrate ($KNO_3$), aluminum oxide ($Al_2O_3$), or lithium niobium oxide ($LiNbO_3$). The second dielectric layer may be formed by a film deposition process, such as a CVD process, a spin-on process, a PECVD process, or a HDPCVD process, followed by a CMP process. In a particular embodiment, the second dielectric layer and the first dielectric layer may be composed of the same material. In an alternate embodiment, the second dielectric layer and the first dielectric layer may be composed of different materials.

In a particular embodiment, the second electrode portions may be formed via a single damascene process. For example, a photolithography and etch process may be performed to pattern the first electrode trenches, and the metal may be deposited into the first electrode trenches to form the second electrode portions. The CMP process may be performed to remove extra metal material and smooth a surface of the second electrode portions and to even out irregular topography. The second electrode portions may be disposed on the first electrode portions and on the gate structures. The metal deposited in the first electrode trenches may be a metal or metal alloy, such as copper (Cu), aluminum-copper alloy (AlCu), tantalum (Ta), titanium (Ti), tungsten (W), or silver (Ag). The second electrode portions may be deposited by a film deposition process, such as a PVD process, a sputtering process, or an electroplating process. In a particular embodiment, the second electrode portions and the first electrode portions may be composed of the same material. In an alternate embodiment, the second electrode portions and the first electrode portions may be composed of different materials.

At 610, a third dielectric layer is deposited and patterned to form via trenches and second electrode trenches. In a particular embodiment, the third dielectric layer may be composed of silicon oxide based materials, such as undoped silicate glass (USG), fluorinated silicate glass (FSG), plasma-enhanced chemical vapor deposition (PECVD) silicon oxide, or oxide/nitride/oxide. In another particular embodiment, the third dielectric layer may be composed of dielectric materials with a high dielectric constant, such as tantalum oxide ($Ta_2O_5$), hafnium oxide ($HfO_2$), hafnium oxynitride (WON), barium strontium titanate ($Ba_zSr_{(1-z)}TiO_3$ (BST)), barium titanium oxide ($BaTiO_3$), strontium titanium oxide ($SrTiO_3$), lead titanium oxide ($PbTiO_3$), lead zirconate titanate ($Pb(Zr,Ti)O_3$ [PZT]), lead lanthanum zirconate titanate (($Pb, La)(Zr,Ti)O_3$ [PLZT], lead lanthanum titanate (($Pb, La)TiO_3$ [PLT], tantalum oxide ($Ta_2O_5$), potassium nitrate ($KNO_3$), aluminum oxide ($Al_2O_3$), or lithium niobium oxide ($LiNbO_3$ The third dielectric layer may be formed by a film deposition process, such as a CVD process, a spin-on process, a PECVD process, or a HDPCVD process, and followed by a CMP process. In a particular embodiment, the first dielectric layer, the second dielectric layer, and the third dielectric layer may be composed of the same material. In an alternative embodiment, the first dielectric layer, the second dielectric layer, and the third dielectric layer may be composed of different materials.

In a particular embodiment, the via trenches and the second electrode trenches may be formed during a dual damascene process. For example, a photolithography and etch process may be applied to the third dielectric layer to pattern the via trenches and the second electrode trenches. The second electrode trenches may include electrode trenches for first electrode connectors and second electrode connectors, such as the first electrode connectors 401 and the second electrode connectors 402 of FIG. 4. In an alternate embodiment, the dual damascene process may be replaced by two single damascene processes.

At 611, metal is deposited into the second electrode trenches and the via trenches, a CMP process is performed on the metal to form via structures and third electrode portions, and a cap film layer is deposited. The third electrode portions may be the first higher metal structure 110 and the second higher metal structure 116 of FIG. 1, the third electrode portions 201 of FIG. 2 or the third electrode portions 201 of FIG. 3. The via structures may be the first via structure 108 and the second via structure 114 of FIG. 1, the conductive connection structures 203 of FIG. 2 or the conductive connection structures 203 of FIG. 3. In a particular embodiment, the via structures may be trench-shape vias. In alternate embodiments, the via, structures may be in any suitable shape, such as rod-shape vias.

In a particular embodiment, the via structures and the third electrode portions may be formed during the dual damascene process. The CMP process may be performed to remove extra metal, smooth the surface of the third electrode portions, even out irregular topography, or a combination thereof. In a particular embodiment, a width of the via structures may be less than a width of the third electrode portions. The metal deposited in the second electrode trenches and via structures may be a metal or metal alloy, such as copper (Cu), aluminum-copper alloy (AlCu), tantalum (Ta), titanium (Ti), tungsten (W), or silver (Ag). In a particular embodiment, the via, structures, the third electrode portions, the second electrode portions, and the first electrode portions may be composed of the same material. In an alternate embodiment, the via structures, the third electrode portions, the second electrode portions, and the first electrode portions may be composed of different materials. Although a damascene process has been described, one of ordinary skill in the art will appreciate that the technique used to form the gate structures, the first electrode portions, the second electrode portions, and the third electrode portions may not be a damascene process; an alternative technique may be adopted depending on the materials to be used or other criteria.

The via structures may be vertically disposed substantially on the second electrode portions, and the third electrode portions may be vertically disposed substantially on the via structures. The third electrode portions and the via structures may be formed by a film deposition process, such as a PVD process, a sputtering process, or an electroplating process. In a particular embodiment, the third electrode portions (and corresponding second electrode portions and corresponding gate structures or corresponding first electrode portions) may be alternately interconnected by the first electrode connector (to form a first set of electrode portions) and by the second electrode connector (to form a second set of electrode portions). Such alternating interconnection of the sets of the electrode portions forms a MOM capacitor with capacitors connected in parallel, as described above with reference to FIG. 4.

After forming the third electrode portions and the via structures, the cap film layer may be deposited. The cap film layer (e.g., an insulation layer) may be deposited to insulate the MOM capacitor from other circuitry and devices. The cap film layer may be formed by a film deposition process, such as a CVD process, a spin-on process, a PECVD process, or a HDPCVD process, followed by a CMP process.

Although not shown in FIG. 6, additional dielectric layers, additional electrode portions, and additional via structures may be formed in the MOM capacitor. The additional dielectric layers, the additional electrode portions, and the additional via structures may be formed via iteration(s) of 610 and 611, after deposit of the cap film layer.

By having the gate structures and the first electrode portions disposed alternately and in parallel, the MOM capacitor formed by the method 600 may be configured according to the smallest permitted distance between electrodes available according to design rules. By having a reduced distance between the gate structures and the first electrode portions, a capacitance between the gate structures and the first electrode portions may be increased based on the reduced distance. Further, by having a reduced distance between the gate structures and the first electrode portions, a footprint (e.g., a surface area) of the MOM capacitor may be reduced as compared to the other configurations (e.g., configurations with adjacent gate structures or adjacent first electrode portions).

Figure 7:
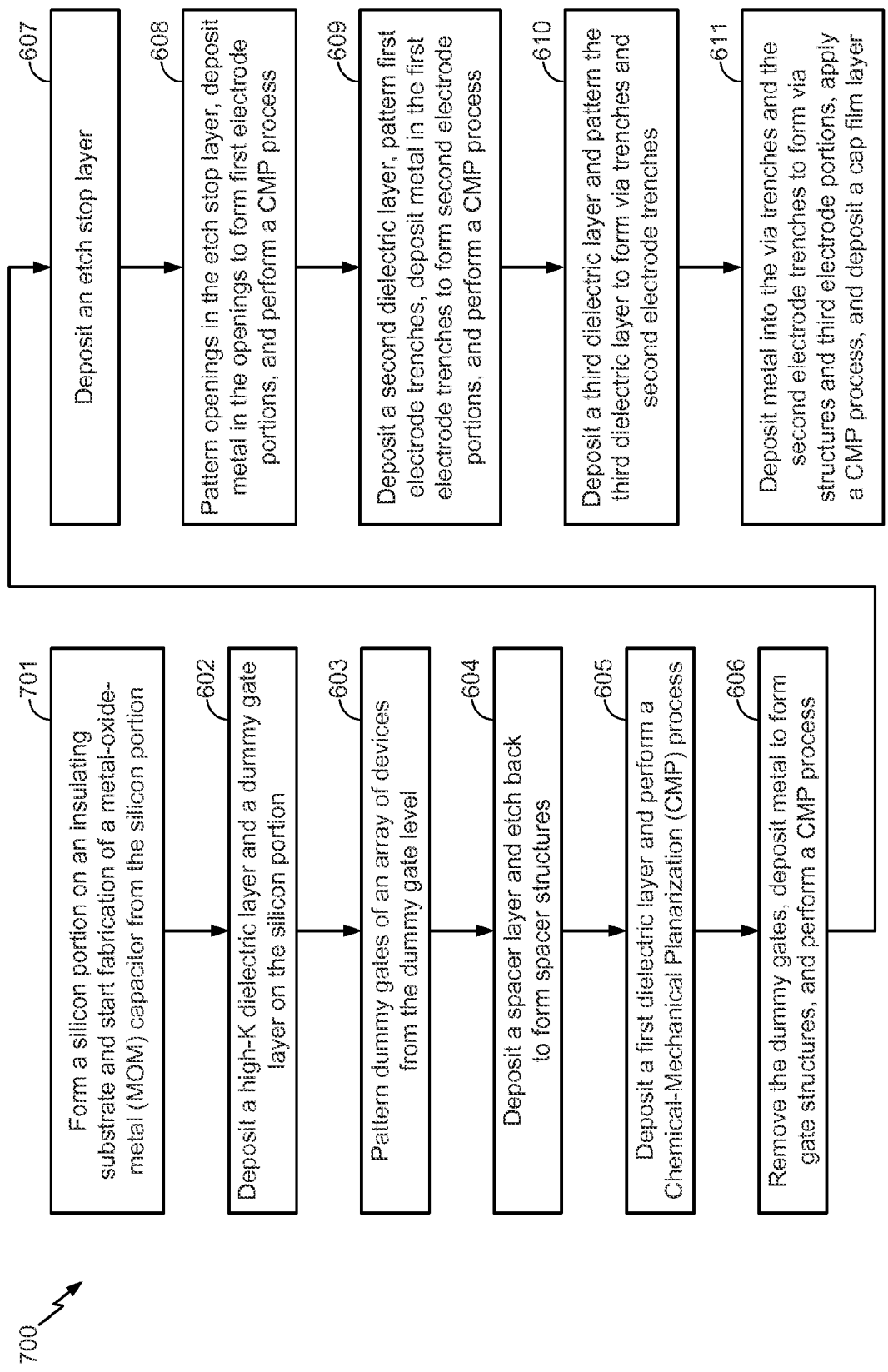
FIG. 7 is a flowchart of a third illustrative embodiment of a method of forming a MOM capacitor.

Referring to FIG. 7, a flow chart of a third illustrative embodiment of a method of forming a MOM capacitor is depicted and generally designated 700. The MOM capacitor may include the MOM capacitor 100 of FIG. 1, the MOM capacitor 200 of FIG. 2, the MOM capacitor 300 of FIG. 3, or the MOM capacitor 400 of FIG. 4.

The method 700 includes forming a silicon portion of an insulation substrate (e.g., a silicon wafer) and starting fabrication of the MOM capacitor from the silicon portion, at 701. The insulating substrate may be the substrate 102 of FIG. 1 or the silicon portion of substrate 302 of FIG. 3. A dielectric material layer may be formed on the silicon portion of the substrate. In a particular embodiment, the dielectric material layer may include a high-k dielectric film (e.g., hafnium oxide (HfOx) or hafnium oxynitride (HfOxN)), and source and drain active areas (e.g., active areas excluding gate areas) may include silicon germanium (SiGe) or silicon carbide (SiC). In another particular embodiment, the dielectric material layer may be an oxide layer, such as the gate oxide layer 301 of FIG. 3, or the intervening dielectric layer 103 of FIG. 1. The dielectric material layer may be formed by a film deposition process, such as a thermal growth process, a chemical vapor deposition (CVD) process, a plasma-enhanced chemical vapor deposition (PECVD) process, or an atomic layer deposit (ALD) process, followed by a chemical-mechanical planarization (CMP) process. The method 700 further includes 602-611, as described with reference to FIG. 6.

By having the gate structures and the first electrode portions disposed alternately and in parallel, the MOM capacitor formed by the method 700 may be configured according to the smallest permitted distance between electrodes available according to design rules. By having a reduced distance between the gate structures and the first electrode portions, a capacitance between the gate structures and the first electrode portions may be increased based on the reduced distance. Further, by having a reduced distance between the gate structures and the first electrode portions, a footprint (e.g., a surface area) of the MOM capacitor may be reduced as compared to the other configurations (e.g., configurations with adjacent gate structures or adjacent first electrode portions). Further, the MOM capacitor formed by the method 700 may provide additional capacitance as compared to the MOM capacitor formed by the method 600. For example, by disposing the MOM capacitor on the silicon portion of the substrate, the MOM capacitor formed by the method 700 may provide a first additional gate capacitance (Cg) across the dielectric material layer and a second additional junction capacitance (Cj) between the dielectric material layer and the first electrode portions due to a PN junction. In a particular embodiment, a material type (e.g., a type of metal) of the gate structures and source and drain doping types are the same as a doping type of the substrate. In the particular embodiment, when a channel of the MOM capacitor is operating in an accumulation mode, the MOM capacitor provides only the first additional gate capacitance (Cg) (e.g., the second additional junction capacitance (Cj) is not provided by the MOM capacitor).

Figure 8:
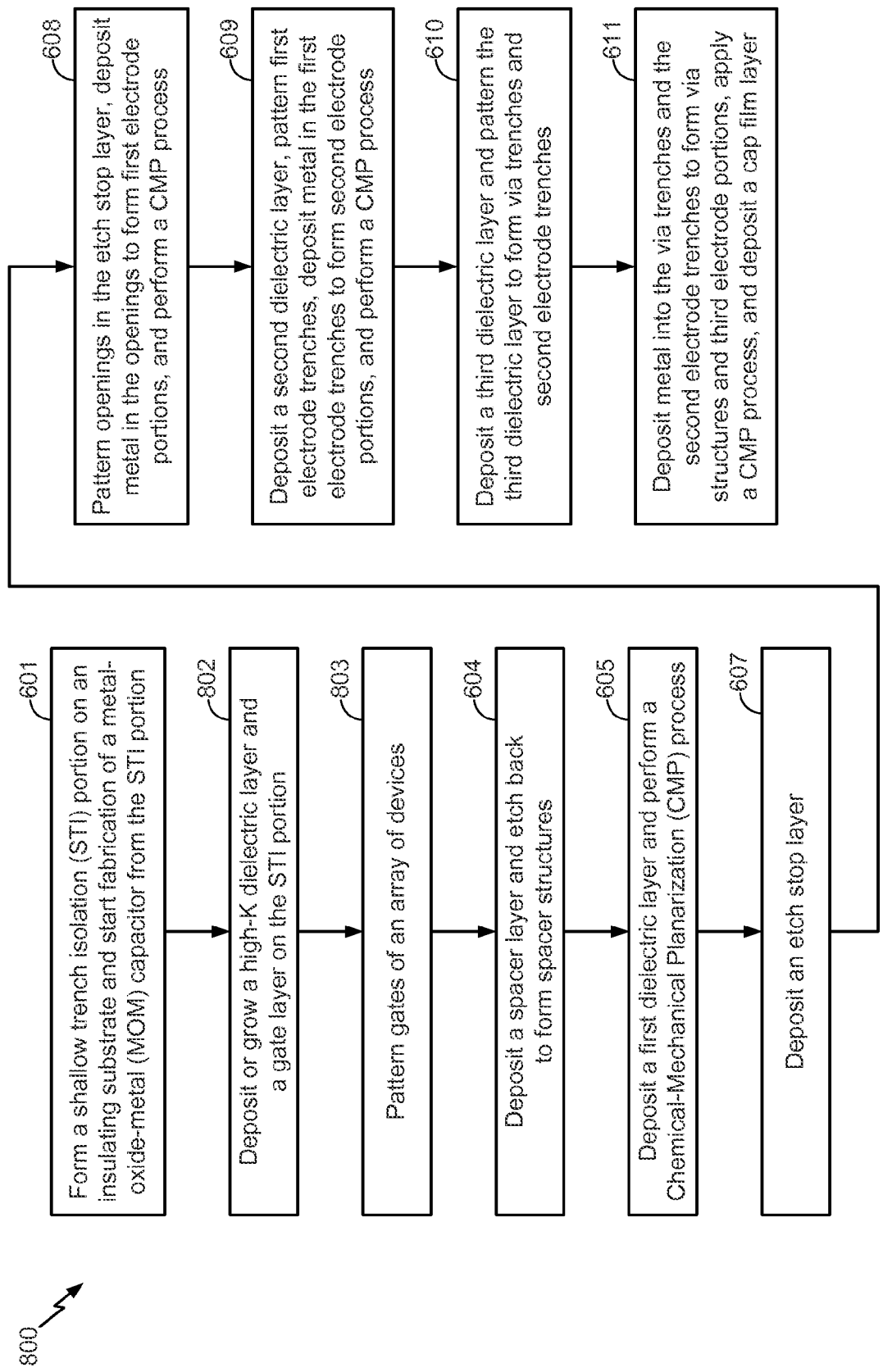
FIG. 8 is a flowchart of a fourth illustrative embodiment of a method of forming a MOM capacitor.

Referring to FIG. 8, a flow chart of a fourth illustrative embodiment of a method of forming a MOM capacitor is depicted and generally designated 800. The MOM capacitor may include the MOM capacitor 100 of FIG. 1, the MOM capacitor 200 of FIG. 2, the MOM capacitor 300 of FIG. 3, or the MOM capacitor 400 of FIG. 4.

The method includes forming a shallow trench isolation (STI) layer on an insulating substrate and starting from the STI layer, at 601, as described with reference to FIG. 6. The insulating substrate may be the substrate 102 of FIG. 1 or the STI portion of the substrate 211 of FIG. 2.

At 802, a high-K dielectric layer and a gate layer are formed or grown. The high-K dielectric layer may be an oxide layer, such as the gate oxide layer 301 of FIG. 3, or the intervening dielectric layer 103 of FIG. 1. A thickness of the high-K dielectric layer or the oxide layer and the gate layer may be any suitable thickness and may accommodate design and functioning criteria of the MOM capacitor. At 803, gates are patterned, such as for an array of transistor-type devices, from the gate layer. In a particular embodiment, a photolithography and etch process may be used to pattern (e.g., form) the gates. A width of the gates may be any suitable width and may accommodate design and functioning criteria of the MOM capacitor. In a particular embodiment, the width of the gates is approximately 20 nm. The method 800 further includes 604-605 and 607-611 as described with reference to FIG. 6.

FIG. 8 illustrates an alternate embodiment to FIG. 6. In FIG. 6, dummy gates are formed at 603 and later removed and replaced with metal at 606. In FIG. 8, gates are formed at 802, and the deposited gate material may remain without being later replaced. For example, a metal film may be deposited and patterned at 802-803 and may not be later removed (e.g., 606 is omitted).

By having the gate structures and the first electrode portions disposed alternately and in parallel, the MOM capacitor formed by the method 800 may be configured according to the smallest permitted distance between electrodes available according to design rules. By having a reduced distance between the gate structures and the first electrode portions, a capacitance between the gate structures and the first electrode portions may be increased based on the reduced distance. Further, by having a reduced distance between the gate structures and the first electrode portions, a footprint (e.g., a surface area) of the MOM capacitor may be reduced as compared to the other configurations (e.g., configurations with adjacent gate structures or adjacent first electrode portions). Further, the MOM capacitor formed by the method 800 may provide enhanced high-frequency characteristics. For example, by disposing the MOM capacitor on the STI portion of the substrate, the MOM capacitor formed by the method 800 may reduce high frequency greater than 1 GHz) signal degradation via the MOM capacitor.

Figure 9:
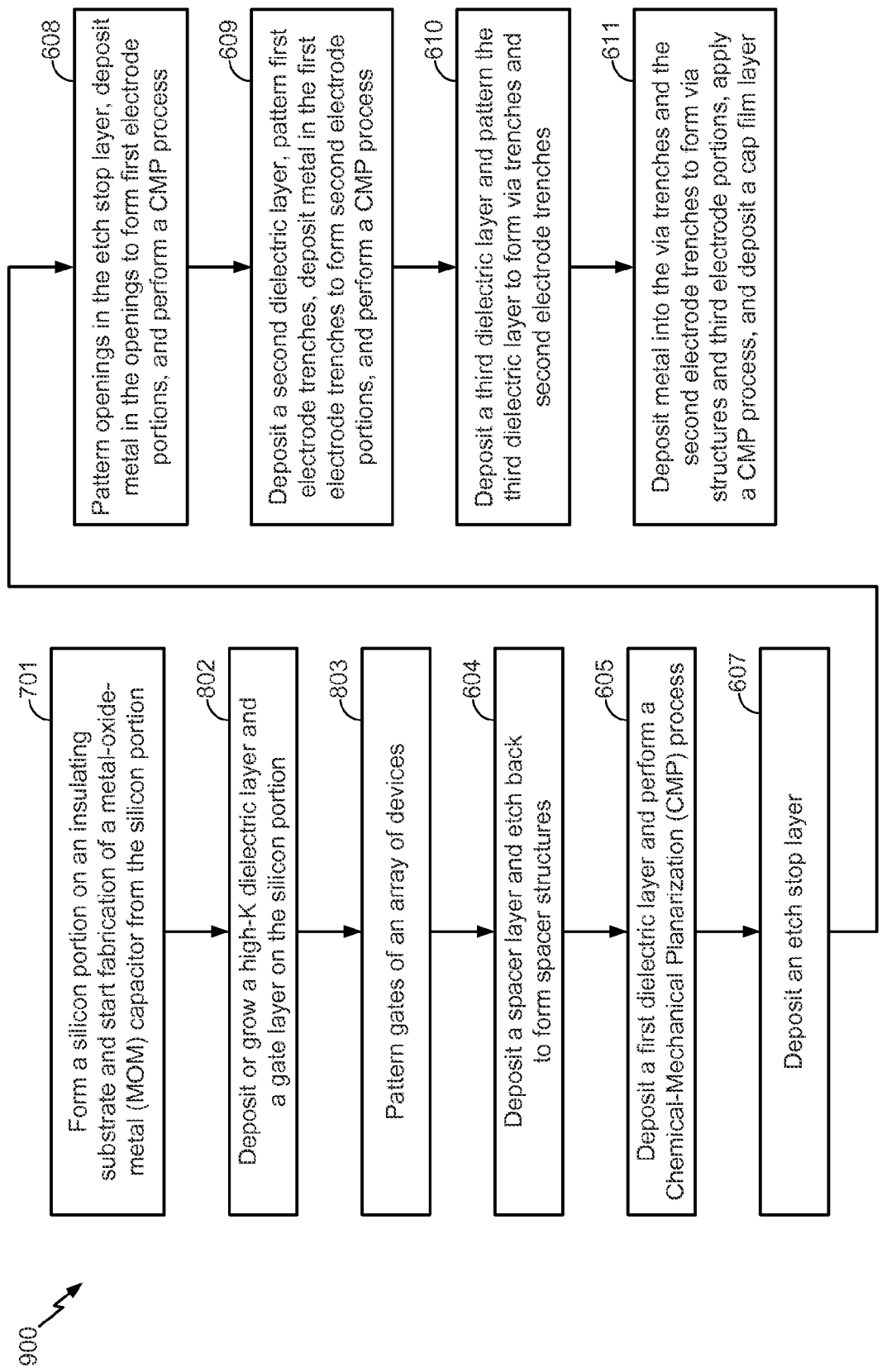
FIG. 9 is a flowchart of a fifth illustrative embodiment of a method of forming a MOM capacitor.

Referring to FIG. 9, a flow chart of a fifth illustrative embodiment of a method of forming a MOM capacitor is depicted and generally designated 900. The MOM capacitor may include the MOM capacitor 100 of FIG. 1, the MOM capacitor 200 of FIG. 2, the MOM capacitor 300 of FIG. 3, or the MOM capacitor 400 of FIG. 4.

The method 900 includes forming a shallow trench isolation (STI) layer on a silicon substrate (e.g., a silicon wafer) and starting from a silicon layer, at 701. The silicon substrate may be the substrate 102 of FIG. 1 or the silicon portion of the substrate 302 of FIG. 3. An insulating material layer may be formed on the silicon substrate. In a particular embodiment, the insulating material layer may be an oxide layer, such as the gate oxide layer 301 of FIG. 3, or the intervening dielectric layer 103 of FIG. 1. A thickness of the insulating material layer may be any suitable thickness and may accommodate design and functioning criteria of the MOM capacitor. The method 900 further includes 802-803, 604, 805-809, and 611, as described above with reference to FIG. 8.

FIG. 9 illustrates an alternate embodiment to FIG. 7. In FIG. 7, dummy gates are formed at 603 and later removed and replaced with metal at 606. In FIG. 9, gates are formed at 802, and the deposited gate material may remain without being later replaced. For example, a metal film may be deposited and patterned at 802-803 and may not be later removed (e.g., 606 is omitted).

By having the gate structures and the first electrode portions disposed alternately and in parallel, the MOM capacitor formed by the method 900 may be configured according to the smallest permitted distance between electrodes available according to design rules. By having a reduced distance between the gate structures and the first electrode portions, a capacitance between the gate structures and the first electrode portions may be increased based on the reduced distance. Further, by having a reduced distance between the gate structures and the first electrode portions, a footprint (e.g., a surface area) of the MOM capacitor may be reduced as compared to the other configurations (e.g., configurations with adjacent gate structures or adjacent first electrode portions). Further, the MOM capacitor formed by the method 900 may provide additional capacitance as compared to the MOM capacitors formed by the methods 600 and 800. For example, by disposing the MOM capacitor on the silicon portion of the substrate, the MOM capacitor formed by the method 900 may provide a first additional capacitance (Cg) across the dielectric material layer and a second additional capacitance (Cj) between the dielectric material layer and the first electrode portions due to a PN junction. In a particular embodiment, a material type (e.g., a type of metal) of the gate structures and source and drain doping types are the same as a doping type of the substrate. In the particular embodiment, when a channel of the MOM capacitor is operating in an accumulation mode, the MOM capacitor provides only the first additional gate capacitance (Cg) (e.g., the second additional junction capacitance (Cj) is not provided by the MOM capacitor).

One or more of the operations described with reference to the methods 500-900 of FIGS. 5-9, respectively, may be initiated by a field-programmable gate array (FPGA) device, an application-specific integrated circuit (ASIC), a processing unit such as a central processing unit (CPU), a digital signal processor (DSP), a controller, another hardware device, a firmware device, or any combination thereof. As an example, the methods 500-900 of FIGS. 5-9, respectively, may be initiated by a processor that executes instructions stored at a memory (e.g., a non-transitory computer-readable medium) integrated within equipment of a semiconductor fabrication plant (e.g., a "fab"), as described further with reference to FIG. 11.

Figure 10:
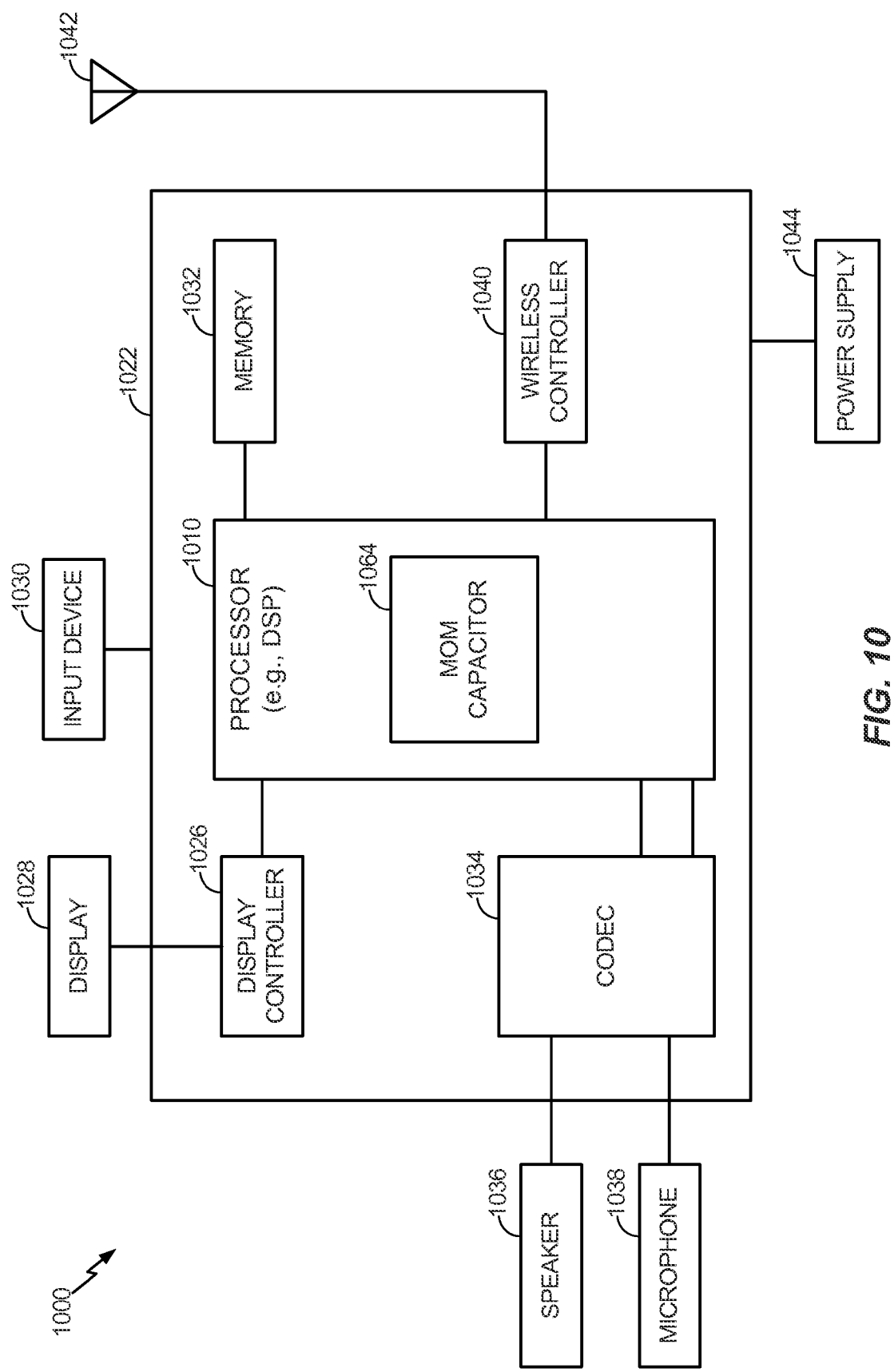
FIG. 10 is a block diagram of a communication device including a MOM capacitor.

Referring to FIG. 10, a block diagram of a particular illustrative embodiment of a mobile device is depicted and generally designated 1000. For example, the mobile device 1000 may include a processor 1010, such as a digital signal processor (DSP). The processor 1010 may include a MOM capacitor 1064, such as the MOM capacitor 100 of FIG. 1, the MOM capacitor 200 of FIG. 2, the MOM capacitor 300 of FIG. 3, or the MOM capacitor 400 of FIG. 4 formed according to the methods of any of FIGS. 5-9. Although the MOM capacitor 1064 is shown as being included in the processor 1010, in alternate embodiments, the MOM capacitor 1064 may be included in other components of the mobile device 1000. The processor 1010 may be coupled to a memory 1032, such as random access memory (RAM), flash memory, read-only memory (ROM), programmable read-only memory (PROW, erasable programmable read-only memory (EPROM), electrically erasable programmable read-only memory (EEPROM), registers, hard disk, a removable disk, a compact disc read-only memory (CD-ROM), a non-transitory computer-readable medium, or any other form of non-transient storage medium known in the art, that stores instructions executable by the processor 1010.

FIG. 10 also shows a display controller 1026 that is coupled to the processor 1010 and to a display 1028. A coder/decoder (CODEC) 1034 can also be coupled to the processor 1010. A speaker 1036 and a microphone 1038 can be coupled to the CODEC 1034. FIG. 10 also indicates that a wireless controller 1040 can be coupled to the processor 1010 and to an antenna 1042.

In a particular embodiment, the processor 1010, the display controller 1026, the memory 1032, the CODEC 1034, and the wireless controller 1040 are included in a system-in-package or system-on-chip device 1022. An input device 1030 and a power supply 1044 may be coupled to the system-on-chip device 1022. Moreover, in a particular embodiment, as illustrated in FIG. 10, the display 1028, the input device 1030, the speaker 1036, the microphone 1038, the antenna 1042, and the power supply 1044 are external to the system-on-chip device 1022. However, each of the display 1028, the input device 1030, the speaker 1036, the microphone 1038, the antenna 1042, and the power supply 1044 can be coupled to a component of the system-on-chip device 1022, such as an interface or a controller. FIG. 10 also depicts that the system-on-chip device 1022 may include the semiconductor device including the MOM capacitor 1064. According to various embodiments, the semiconductor device including the MOM capacitor 1064 may be coupled to (or integrated within) one or more of the components of the mobile device 1000, depending on the particular application.

Figure 11:
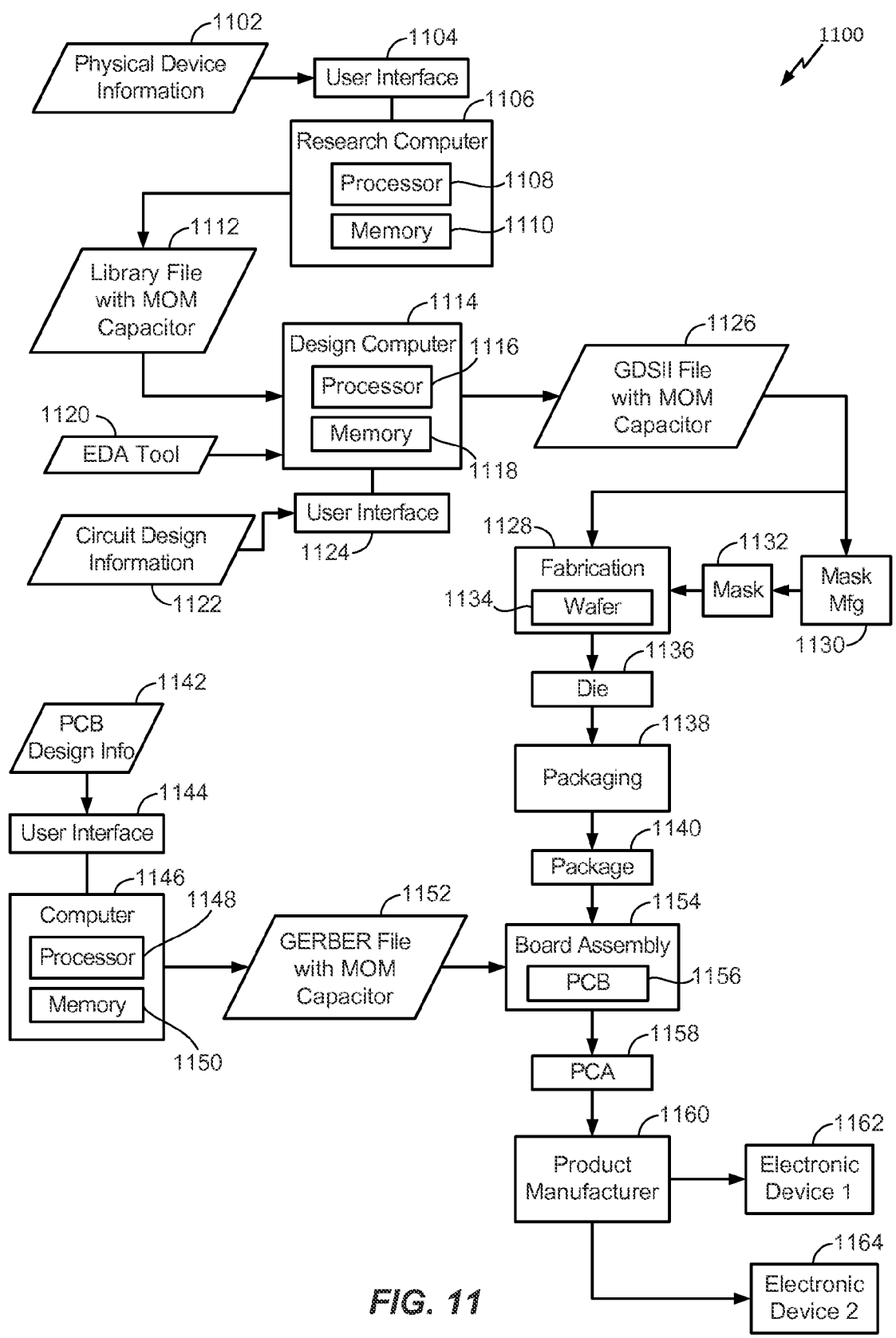
FIG. 11 is a data flow diagram of a particular illustrative embodiment of a manufacturing process to manufacture electronic devices that include a MOM capacitor.

The foregoing disclosed devices and functionalities may be designed and configured into computer files (e.g., RTL, GDSII, GERBER, etc) stored on computer readable media. Some or all such files may be provided to fabrication handlers to fabricate devices based on such files. Resulting products include semiconductor wafers that are then cut into semiconductor dies and packaged into semiconductor chips. The semiconductor chips are then employed in electronic devices. FIG. 11 depicts a particular illustrative embodiment of an electronic device manufacturing process 1100.

Physical device information 1102 is received at the manufacturing process 1100, such as at a research computer 1106. The physical device information 1102 may include design information representing at least one physical property of a semiconductor device. For example, the physical device information 1102 may include physical parameters, material characteristics, and structure information that is entered via a user interface 1104 coupled to the research computer 1106. The research computer 1106 includes a processor 1108, such as one or more processing cores, coupled to a computer-readable medium such as a memory 1110. The memory 1110 may store computer-readable instructions that are executable to cause the processor 1108 to transform the physical device information 1102 to comply with a file format and to generate a library file 1112.

In a particular embodiment, the library file 1112 includes at least one data file including the transformed design information. For example, the library file 1112 may include a library of semiconductor devices, including a semiconductor device including the MOM capacitor 100 of FIG. 1, the MOM capacitor 200 of FIG. 2, the MOM capacitor 300 of FIG. 3, or the MOM capacitor 400 of FIG. 4, formed according to the methods of any of FIGS. 5-9, provided for use with an electronic design automation (EDA) tool 1120.

The library file 1112 may be used in conjunction with the FDA tool 1120 at a design computer 1114 including a processor 1116, such as one or more processing cores, coupled to a memory 1118. The EDA tool 1120 may be stored as processor executable instructions at the memory 1118 to enable a user of the design computer 1114 to design a circuit including the MOM capacitor using the library file 1112. For example, a user of the design computer 1114 may enter circuit design information 1122 via a user interface 1124 coupled to the design computer 1114. The circuit design information 1122 may include design information representing at least one physical property of a semiconductor device, such as a semiconductor device including the MOM capacitor. To illustrate, the circuit design property may include identification of particular circuits and relationships to other elements in a circuit design, positioning information, feature size information, interconnection information, or other information representing a physical property of a semiconductor device.

The design computer 1114 may be configured to transform the design information, including the circuit design information 1122, to comply with a file format. To illustrate, the file formation may include a database binary file format representing planar geometric shapes, text labels, and other information about a circuit layout in a hierarchical format, such as a Graphic Data System (GDSII) file format. The design computer 1114 may be configured to generate a data file including the transformed design information, such as a GOSH file 1126 that includes information describing a semiconductor device including the MOM capacitor, in addition to other circuits or information. To illustrate, the data file may include information corresponding to a system-on-chip (SOC) that includes a semiconductor device including the MOM capacitor and that also includes additional electronic circuits and components within the SOC.

The GDSII file 1126 may be received at a fabrication process 1128 to manufacture a semiconductor device including the MOM capacitor and according to transformed information in the GDSII file 1126. For example, a device manufacture process may include providing the GDSII file 1126 to a mask manufacturer 1130 to create one or more masks, such as masks to be used with photolithography processing, illustrated in FIG. 11 as a representative mask 1132. The mask 1132 may be used during the fabrication process to generate one or more wafers 1134, which may be tested and separated into dies, such as a representative die 1136. The die 1136 includes a circuit including a semiconductor device including the MOM capacitor.

The die 1136 may be provided to a packaging process 1138 where the die 1136 is incorporated into a representative package 1140. For example, the package 1140 may include the single die 1136 or multiple dies, such as a system-in-package (SiP) arrangement. The package 1140 may be configured to conform to one or more standards or specifications, such as Joint Electron Device Engineering Council (JEDEC) standards.

Information regarding the package 1140 may be distributed to various product designers, such as via a component library stored at a computer 1146. The computer 1146 may include a processor 1148, such as one or more processing cores, coupled to a memory 1150. A printed circuit board (PCB) tool may be stored as processor executable instructions at the memory 1150 to process PCB design information 1142 received from a user of the computer 1146 via a user interface 1144. The PCB design information 1142 may include physical positioning information of a packaged semiconductor device on a circuit board, the packaged semiconductor device corresponding to the package 1140 including a semiconductor device including the MOM capacitor.

The computer 1146 may be configured to transform the PCB design information 1142 to generate a data file, such as a GERBER file 1152 with data that includes physical positioning information of a packaged semiconductor device on a circuit board, as well as layout of electrical connections such as traces and vias, where the packaged semiconductor device corresponds to the package 1140 including a semiconductor device including the MOM capacitor. In other embodiments, the data file generated by the transformed PCB design information may have a format other than a GERBER format.

The GERBER file 1152, may be received at a board assembly process 1154 and used to create PCBs, such as a representative PCB 1156, manufactured in accordance with the design information stored within the GERBER file 1152. For example, the GERBER file 1152 may be uploaded to one or more machines to perform various steps of a PCB production process. The PCB 1156 may be populated with electronic components including the package 1140 to form a representative printed circuit assembly (PCA) 1158.

The PCA 1158 may be received at a product manufacture process 1160 and integrated into one or more electronic devices, such as a first representative electronic device 1162 and a second representative electronic device 1164. As an illustrative, non-limiting example, the first representative electronic device 1162, the second representative electronic device 1164, or both, may be selected from the group of a set top box, a music player, a video player, an entertainment unit, a navigation device, a communications device, a personal digital assistant (PDA), a fixed location data unit, and a computer, into which a semiconductor device including the MOM capacitor is integrated. As another illustrative, non-limiting example, one or more of the representative electronic devices 1162 and 1164 may be remote units such as mobile phones, hand-held personal communication systems (PCS) units, portable data units such as personal data assistants, global positioning system (GPS) enabled devices, navigation devices, fixed location data units such as meter, reading equipment, or any other device that stores or retrieves data or computer instructions, or any combination thereof. Although FIG. 11 illustrates remote units according to teachings of the disclosure, the disclosure is not limited to these illustrated units. Embodiments of the disclosure may be suitably employed in any device which includes active integrated circuitry including memory and on-chip circuitry.

A device that includes a semiconductor device including the MOM capacitor may be fabricated, processed, and incorporated into an electronic device, as described in the illustrative process 1100. One or more aspects of the embodiments disclosed with respect to FIGS. 1-11 may be included at various processing stages, such as within the library file 1112, the GDSII file 1126, and the GERBER file 1152, as well as stored at the memory 1110 of the research computer 1106, the memory 1118 of the design computer 1114, the memory 1150 of the computer 1146, the memory of one or more other computers or processors (not shown) used at the various stages, such as at the board assembly process 1154, and also incorporated into one or more other physical embodiments such as the mask 1132, the die 1136, the package 1140, the PCA 1158, other products such as prototype circuits or devices (not shown), or any combination thereof. Although various representative stages are depicted with reference to FIGS. 1-11, in other embodiments fewer stages may be used or additional stages may be included. Similarly, the process 1100 of FIG. 11 may be performed by a single entity or by one or more entities performing various stages of the process 1100.

In conjunction with the described embodiments, an apparatus is disclosed that includes a MOM capacitor device. The MOM capacitor device includes first means for conducting charge coupled to a substrate. The first means for conducting charge may be the first metal structure 106 or the first electrode 140 of FIG. 1, the electrode 140 of FIG. 2, the electrode 140 of FIG. 3, or the electrode 140 of FIG. 4. The substrate may be the substrate 102 of FIG. 1, the STI portion of the substrate 211 of FIG. 2, or the silicon portion of the substrate 302 of FIG. 3. The first means for conducting charge may correspond to a first capacitor plate of a plate capacitor. The first means for conducting charge includes a conductive gate material. The conductive gate material may be the conductive gate material 104 of FIG. 1, the gate structures 208 of FIG. 2 or the gate structures 208 of FIG. 3.

The MOM capacitor device further includes second means for conducting charge coupled to the substrate. The second means for conducting charge may correspond to a second capacitor plate of the plate capacitor. The second means for conducting charge may be the second metal structure 112 or the second electrode 142 of FIG. 1, the electrode 142 of FIG. 2, the electrode 142 of FIG. 3, or the electrode 142 of FIG. 4. The second means for conducting charge includes a contact metal. The contact metal may be the contact metal 120 of FIG. 1, the first electrode portions 207 of FIG. 2, or the first electrode portions 207 of FIG. 3. The first means for conducting charge is proximate to the second means for conducting charge.

In a particular embodiment, the first means for conducting charge and the second means for conducting charge may be connected to a first signal source and a second signal source, respectively, and may conduct charge based on a voltage difference between the first signal source and the second signal source. For example, the first means for conducting charge and the second means for conducting charge may operate in a manner similar to the first capacitor plate and the second capacitor plate of a plate capacitor, or similar to any of the electrodes 140, 142, and 212-214 of FIGS. 2-4. The MOM capacitor device may be integrated within an electronic device, such as the first representative electronic device 1162, the second representative electronic device 1164, or a combination thereof.

In conjunction with the described embodiments, a non-transitory computer-readable medium stores instructions executable by a computer to initiate fabrication of a MOM capacitor device. For example, the non-transitory computer readable medium may store instructions executable by the computer to initiate fabrication of the MOM capacitor device based on any of the methods 500-900. The MOM capacitor device may be the MOM capacitor 100 of FIG. 1, the MOM capacitor 200 of FIG. 2, the MOM capacitor 300 of FIG. 3, or the MOM capacitor 400 of FIG. 4.

The fabrication of the MOM capacitor device includes forming a first electrode. The first electrode may include a conductive gate material. The conductive gate material may be the conductive gate material 104 of FIG. 1, the gate structures 208 of FIG. 2, or the gate structures 208 of FIG. 3.

The fabrication of the MOM capacitor device further includes forming a second electrode. The second electrode may include a contact metal. The contact metal may be the contact metal 120 of FIG. 1, the first electrode portions 207 of FIG. 2, or the first electrode portions 207 of FIG. 3. The first electrode is proximate to the second electrode. The processor and the memory may be integrated within an electronic device, such as equipment of a semiconductor fabrication plant.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following

What is claimed is:

1. A metal-oxide-metal (MOM) capacitor device comprising:
   a conductive gate material coupled to a substrate;
   a first metal structure coupled to the conductive gate material; and
   a second metal structure coupled to the substrate and proximate to the first metal structure, wherein the second metal structure includes a contact metal, wherein the contact metal includes at least one material not in common with the conductive gate material, and wherein the second metal structure is coupled to a higher metal structure by a via structure.

2. The MOM capacitor device of claim 1, further comprising a gate dielectric layer coupling the conductive gate material to the substrate.

3. The MOM capacitor device of claim 1, wherein the conductive gate material is coupled to a shallow trench isolation (STI) portion of the substrate.

4. The MOM capacitor device of claim 1, wherein the conductive gate material is coupled to a silicon portion of the substrate.

5. The MOM capacitor device of claim 1, wherein, when a first electrode that includes the conductive gate material and the first metal structure is biased by a first voltage and a second electrode that includes the second metal structure is based by a second voltage, a total capacitance between the first electrode and the second electrode includes a capacitance between the conductive gate material and the contact metal.

6. The MOM capacitor device of claim 1, wherein a gate-to-contact pitch between the conductive gate material and the contact metal is a minimum allowed by a design rule.

7. The MOM capacitor device of claim 1, wherein a gate-to-contact pitch between the conductive gate material and the contact metal is less than a contact-to-contact pitch between two adjacent contact metals and is less than a gate-to-gate pitch between two adjacent conductive gate materials.

8. The MOM capacitor device of claim 1, wherein the conductive gate material, the first metal structure, and the second metal structure are integrated in at least one semiconductor die.

9. The MOM capacitor device of claim 1, further comprising a set top box, a music player, a video player, an entertainment unit, a navigation device, a communications device, a personal digital assistant (PDA), a fixed location data unit, a computer, or a combination thereof, into which the conductive gate material, the first metal structure, and the second metal structure are integrated.

10. A method of forming a metal-oxide-metal (MOM) capacitor device, the method comprising:
   forming a first electrode, wherein the first electrode includes a conductive gate material coupled to a substrate;
   forming a second electrode coupled to the substrate and proximate to the first electrode, wherein the second electrode includes a metal structure that includes a contact metal, and wherein the contact metal includes at least one material not in common with the conductive gate material; and
   forming a via structure that couples the metal structure to a higher metal structure.

11. The method of claim 10, wherein a gate-to-contact pitch between the conductive gate material and the contact metal is a minimum allowed by a design rule.

12. The method of claim 10, wherein a gate-to-contact pitch between the conductive gate material and the contact metal is less than a contact-to-contact pitch between two adjacent contact metals and is less than a gate-to-gate pitch between two adjacent conductive gate materials.

13. The method of claim 10, wherein forming the first electrode and forming the second electrode are initiated by a processor integrated into an electronic device.

14. A metal-oxide-metal (MOM) capacitor device comprising:
    first means for conducting charge coupled to a substrate, wherein the first means for conducting charge corresponds to a first capacitor plate, wherein the first means for conducting charge includes a conductive gate material;
    second means for conducting charge coupled to the substrate, wherein the second means for conducting charge corresponds to a second capacitor plate, wherein the second means for conducting charge includes a contact metal, wherein the contact metal includes at least one material not in common with the conductive gate material, and wherein the first means for conducting charge is proximate to the second means for conducting charge; and
    third means for conducting charge coupling the contact metal to a higher metal structure.

15. The MOM capacitor device of claim 14, further comprising a gate oxide layer coupling the first means for conducting charge to the substrate.

16. The MOM capacitor device of claim 14, wherein the first means for conducting charge is coupled to a silicon portion of the substrate.

17. The MOM capacitor device of claim 14, wherein the first means for conducting charge is coupled to a shallow trench isolation (STI) portion of the substrate.

18. The MOM capacitor device of claim 14, wherein the first means for conducting charge and the second means for conducting charge are integrated in at least one semiconductor die.

19. The MOM capacitor device of claim 14, further comprising a set top box, a music player, a video player, an entertainment unit, a navigation device, a communications device, a personal digital assistant (PDA), a fixed location data unit, a computer, or a combination thereof, into which the first means for conducting charge and the second means for conducting charge are integrated.

20. A non-transitory computer-readable medium comprising processor-executable instructions that, when executed by a processor, cause the processor to:
    initiate fabrication of a metal-oxide-metal (MOM) capacitor device, the MOM capacitor device fabricated by:
        forming a first electrode, wherein the first electrode includes a conductive gate material; and
        forming a second electrode, wherein the second electrode includes a contact metal, wherein the contact metal includes at least one material not in common with the conductive gate material, wherein the first electrode is proximate to the second electrode, and wherein the first electrode is coupled to a first higher metal structure by a first via structure.

21. The non-transitory computer-readable medium of claim 20, wherein a gate-to-contact pitch between the conductive gate material and the contact metal is a minimum allowed by a design rule.

22. The non-transitory computer-readable medium of claim 20, wherein a gate-to-contact pitch between the conductive gate material and the contact metal is less than a contact-to-contact pitch between two adjacent contact metals or a gate-to-gate pitch between two adjacent conductive gate materials.

23. A method comprising:
    receiving a data file including design information corresponding to a semiconductor device; and fabricating the semiconductor device according to the design information, wherein the semiconductor device includes a metal-oxide-metal (MOM) capacitor, the MOM capacitor including:
        a conductive gate material coupled to a substrate;
        a first metal structure coupled to the conductive gate material; and
        a second metal structure coupled to the substrate and proximate to the first metal structure, wherein the second metal structure includes a contact metal, wherein the contact metal includes at least one material not in common with the conductive gate material, and wherein the first metal structure is coupled to a first higher metal structure by a first via structure.

24. The method of claim 23, wherein the data file has a GDSII format.

25. The method of claim 23, wherein the data file has a GERBER format.

* * * * *